(12) United States Patent
Li

(10) Patent No.: US 12,311,980 B2
(45) Date of Patent: May 27, 2025

(54) METHOD AND APPARATUS FOR GENERATING A SIMULATION SCENE, ELECTRONIC DEVICE AND STORAGE MEDIUM

(71) Applicant: APOLLO INTELLIGENT CONNECTIVITY (BEIJING) TECHNOLOGY CO., LTD., Beijing (CN)

(72) Inventor: Suwen Li, Beijing (CN)

(73) Assignee: APOLLO INTELLIGENT CONNECTIVITY (BEIJING) TECHNOLOGY CO., LTD., Beijing (CN)

( * ) Notice: Subject to any disclaimer, the term of this patent is extended or adjusted under 35 U.S.C. 154(b) by 168 days.

(21) Appl. No.: 17/841,890

(22) Filed: Jun. 16, 2022

(65) Prior Publication Data
US 2023/0415787 A1    Dec. 28, 2023

(30) Foreign Application Priority Data
Jun. 16, 2021   (CN) .......................... 202110666628.5

(51) Int. Cl.
*B60W 60/00*     (2020.01)
*B60W 30/095*    (2012.01)
(Continued)

(52) U.S. Cl.
CPC .... *B60W 60/0027* (2020.02); *B60W 30/0956* (2013.01); *B60W 30/18159* (2020.02);
(Continued)

(58) Field of Classification Search
CPC ......... B60W 60/0027; B60W 30/0956; B60W 30/18159; B60W 40/04;
(Continued)

(56) References Cited

U.S. PATENT DOCUMENTS 11,971,723 B2 *    4/2024   Du .................. G06F 11/3688
2021/0341935 A1 *  11/2021  Du ...................... G05D 1/81

FOREIGN PATENT DOCUMENTS

CN    108931927 A  * 12/2018   ............. G05B 17/02
CN    111091739 A    5/2020
(Continued)

OTHER PUBLICATIONS

European Search Report for Application 22179075.1, dated Nov. 21, 2022, 10 pages.
(Continued)

*Primary Examiner* — Peter D Nolan
*Assistant Examiner* — Anwar Mohamed
(74) *Attorney, Agent, or Firm* — Lippes Mathias LLP

(57) ABSTRACT

The disclosure provides a method for generating a simulation scene. The method includes: obtaining traffic element information related to intersections contained in a map to be processed, first driving parameter information of a target vehicle, and second driving parameter information of an obstacle vehicle; generating a first trajectory corresponding to the target vehicle based on the first driving parameter information and the traffic element information; generating a second trajectory corresponding to the obstacle vehicle based on the second driving parameter information and the traffic element information; and generating a simulation scene based on the first trajectory, the second trajectory, the first driving parameter information, the second driving parameter information, and the traffic element information.

18 Claims, 6 Drawing Sheets

(51) Int. Cl.
  *B60W 30/18* (2012.01)
  *B60W 40/04* (2006.01)

(52) U.S. Cl.
  CPC ..... *B60W 40/04* (2013.01); *B60W 2554/4029* (2020.02); *B60W 2554/4041* (2020.02); *B60W 2554/4044* (2020.02); *B60W 2554/4046* (2020.02); *B60W 2555/60* (2020.02); *B60W 2556/40* (2020.02)

(58) Field of Classification Search
  CPC . B60W 2554/4041; B60W 2554/4044; B60W 2554/4046; B60W 2555/60; B60W 2556/40; G06F 30/20; G06F 16/29; G01C 21/3841
  See application file for complete search history.

(56) References Cited

FOREIGN PATENT DOCUMENTS

| CN | 111625950 A | 9/2020 |
| CN | 111694287 A | 9/2020 |
| CN | 112650224 A | 4/2021 |
| CN | 112668153 A | 4/2021 |
| CN | 112926135 A | 6/2021 |
| JP | 2007072809 A | 3/2007 |
| JP | 2019032708 A | 2/2019 |
| JP | 2019167039 A | 10/2019 |
| WO | 2019000417 A1 | 1/2019 |

OTHER PUBLICATIONS

Office Action for Japanese Application No. 2022-078772, dated Jun. 6, 2023, 19 pages.

Office Action for Chinese Application No. 202110666628.5, dated Jun. 13, 2023, 52 pages.

* cited by examiner

METHOD AND APPARATUS FOR GENERATING A SIMULATION SCENE, ELECTRONIC DEVICE AND STORAGE MEDIUM

CROSS REFERENCE TO RELATED APPLICATIONS

This application claims priority and benefits to Chinese Application No. 202110666628.5, filed on Jun. 16, 2021, the entire content of which is incorporated herein by reference.

TECHNICAL FIELD

The disclosure relates to a field of artificial intelligence technologies, fields of intelligent transportation technologies and automatic driving technologies, and more particularly to a method for generating a simulation scene, an apparatus for generating a simulation scene, an electronic device and a storage medium.

BACKGROUND

With the rapid development of computer technology, automatic driving has received extensive attention. In order to improve the safety and reliability of the automatic driving system, the automatic driving process is often simulated through the automatic driving system. During this process, an autonomous driving simulation scene is established for simulation.

The road type involved in the simulation scene of intersections is complex, and the types of traffic objects and actions are diverse. How to generate the simulation scene of the intersections conveniently and efficiently is of great significance for the automatic driving simulation scene of the intersections.

SUMMARY

According to a first aspect, the disclosure provides a method for generating a simulation scene. The method includes:

obtaining traffic element information related to intersections contained in a map to be processed, first driving parameter information of a target vehicle, and second driving parameter information of an obstacle vehicle;

generating a first trajectory corresponding to the target vehicle based on the first driving parameter information and the traffic element information;

generating a second trajectory corresponding to the obstacle vehicle based on the second driving parameter information and the traffic element information; and generating a simulation scene based on the first trajectory, the second trajectory, the first driving parameter information, the second driving parameter information, and the traffic element information.

According to a second aspect, the disclosure provides an electronic device. The electronic device includes: at least one processor and a memory communicatively coupled to the at least one processor. The memory stores instructions executable by the at least one processor, and when the instructions are executed by the at least one processor, the at least one processor is enabled to implement the method for generating a simulation scene as described above.

According to a third aspect, the disclosure provides a non-transitory computer-readable storage medium storing computer instructions. The computer instructions are configured to cause the computer to implement the method for generating a simulation scene as described above.

It is understandable that the content described in this section is not intended to identify the key or important features of the embodiments of the disclosure, nor is it intended to limit the scope of the disclosure. Additional features of the disclosure will be easily understood through the following description.

BRIEF DESCRIPTION OF THE DRAWINGS

The drawings are used to help to well understand the solution and do not constitute a limitation of the disclosure.

DETAILED DESCRIPTION

Figure 1:
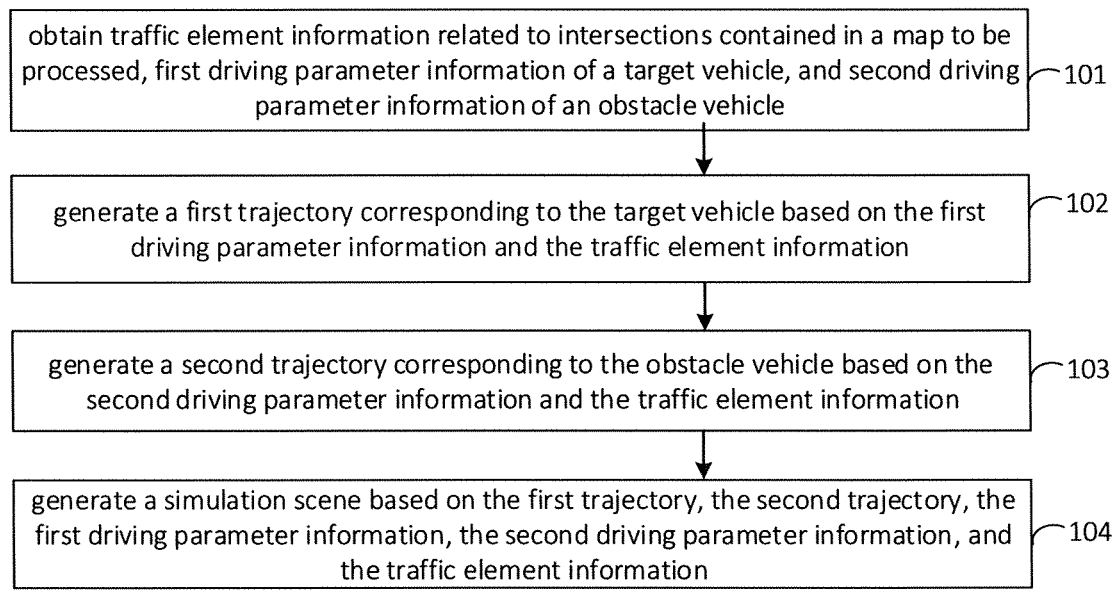
FIG. 1 is a flowchart illustrating a method for generating a simulation scene according to a first embodiment of the disclosure.

The embodiments of the disclosure are described below in combination with the accompanying drawings, which include various details of the embodiments of the disclosure to aid in understanding, and should be considered merely as examples. Therefore, those skilled in the art should know that various changes and modifications can be made to the embodiments described herein without departing from the scope and spirit of the disclosure. For the sake of clarity and brevity, descriptions of well-known features and structures have been omitted from the following description.

It is to be noted that, in the technical solution of the disclosure, the acquisition, storage and use of user's personal information all comply with corresponding provisions of relevant laws and regulations, and do not violate public order and customs.

It is understandable that with the rapid development of computer technology, the autonomous driving has received widespread attention. In order to improve the safety and reliability of the autonomous driving system, the autonomous driving process can be simulated through the autonomous driving system. During this process, an autonomous driving simulation scene is established for simulation.

Road types involved in simulation scenes of intersections are complex, and the types of traffic objects and actions are diverse. How to generate the simulation scenes of intersections conveniently and efficiently is of great significance for the automatic driving simulation scene of the intersections.

There are many means to establish the automatic driving simulation scene on the market, including mature commercial software and scene generation software developed by related companies. However, the above means all require users to manually design and edit the simulation scenes of the intersections. Manual design and editing of the simulation scene of the intersections are inefficient and time-consuming. Before the autonomous driving project is launched, it needs to conduct sufficient intersection simulation tests, which requires the generation of a large number of rich simulation scenes of intersections as supports in a short period of time, causing that the manual design and editing methods cannot meet the requirements. In addition, due to the limitation of human thinking and energy, the manually designed simulation scenes of intersections are limited. The scenes which are considered by the scene design engineer to be important can be designed, and not all of possible scenes within the regions of the intersections can be designed, resulting in missing of simulation scenes. The capability boundary of the automatic driving function when passing the intersections, especially complex intersections, cannot be found in time in the simulation stage.

In view of the above problems, the disclosure provides a method for generating a simulation scene, an apparatus for generating a simulation scene, an electronic device, a storage medium, and a computer program product. According to the method for generating a simulation scene, traffic element information related to intersections contained in the map to be processed is obtained, first driving parameter information of a target vehicle is obtained, and second driving parameter information of an obstacle vehicle is obtained. A first trajectory corresponding to the target vehicle is generated based on the first driving parameter information and traffic element information. A second trajectory corresponding to the obstacle vehicle is generated based on the second driving parameter information and the traffic element information. A simulation scene is generated based on the first trajectory, the second trajectory, the first driving parameter information, the second driving parameter information, and the traffic element information. In this way, the simulation scene of intersections can be generated automatically and efficiently based on the traffic element information related to the intersections contained in the map to be processed, the first driving parameter information of the target vehicle and the second driving parameter information of the obstacle vehicle, which saves a lot of labor and saves time cost, and improves the coverage of the scene.

The method for generating a simulation scene, the apparatus for generating a simulation scene, the related electronic device, the related storage medium, and the related computer program product will be described with reference to the accompanying drawings.

As illustrated in FIG. 1, the method for generating a simulation scene according to the disclosure will be described in detail.

FIG. 1 is a flowchart illustrating a method for generating a simulation scene according to a first embodiment of the disclosure. It is be noted that, in the method for generating a simulation scene of this embodiment, the execution subject of the method is the apparatus for generating a simulation scene, hereinafter referred to as a generating apparatus. The generating apparatus may be an electronic device, or may be arranged in an electronic device to realize automatic and efficient generation of the simulation scene of the intersections, which saves a lot of labor and saves time cost, and improves the coverage of the scene. The disclosure is described by taking that the generating apparatus is arranged in an electronic device as an example.

The electronic device can be any stationary or mobile computing device capable of data processing, such as mobile computing devices, for example notebook computers, smart phones, and wearable devices, or stationary computing devices for example desktop computers, servers, or other types of computing devices, which are not limited in this disclosure.

As illustrated in FIG. 1, the method for generating a simulation scene includes the following. In block 101, traffic element information related to intersections contained in a map to be processed, first driving parameter information of a target vehicle, and second driving parameter information of an obstacle vehicle are obtained.

In the disclosure, the high-precision map can be used as the map to be processed, and the information of the high-precision map can be read in a manner of deserialization, to obtain the traffic element information related to the intersections contained in the map.

The traffic element information related to the intersections may include various information related to the intersections, such as lane information of the lanes around the intersections, and state information of the traffic lights at the intersections. The lane information may include type information, such as T-shaped intersection type, crossroad intersection type or the like, information about the number of lanes around an intersection, such as two lanes, three lanes or the like, information about the allowed traveling directions of a lane around an intersection, such as straight lane, left-turn lane or the like, and any information of the lanes around the intersections. The state information of the traffic lights at the intersections may include for example the color of a traffic light corresponding to each traveling direction of an intersection.

It is be noted that in block S101, the traffic element information related to all intersections throughout the map to the processed can be obtained. Therefore, the traffic element information related to the intersections contained in the map to be processed obtained in block S101, refers to the traffic element information related to all intersections contained in the whole map to be processed. Alternatively, in block S101, the traffic element information related to the intersections within a preset region of the map to be processed can be obtained. Therefore, the obtained traffic element information refers to the traffic element information related to intersections within a preset region. Which traffic element information is obtained can be determined as needed, and is not limited in the disclosure.

In an example, the first driving parameter information of the target vehicle may be defined by the user as required. The second driving parameter information of the obstacle vehicle may be defined by the user as required, or may be acquired based on a real traffic flow, which is not limited in the disclosure. The traffic flow includes the flow of vehicles and the flow of pedestrians on the road.

The first driving parameter information of the target vehicle can include any driving parameter information related to the target vehicle, such as first driving behavior information of the target vehicle, speed information of the target vehicle, start point position information of the first trajectory corresponding to the target vehicle, and end point position information of the first trajectory. The first driving behavior information of the target vehicle may include action information of the target vehicle, such as turning left, turning right, going straight ahead and making a U-turn. The start point position information of the first trajectory corresponding to the target vehicle can be used to determine the start point position of the first trajectory corresponding to the target vehicle. For example, the start point position information may be a distance between the start point position of the first trajectory and a position of a stop line of the lane where the target vehicle is located, where the stop line is prior to the intersection to be passed when the target vehicle is traveling along the lane. Therefore, according to the position of the stop line and the distance, the start point position of the first trajectory can be determined. The end point position information of the first trajectory corresponding to the target vehicle may be used to determine the end point position of the first trajectory corresponding to the target vehicle. For example, the end point position information may be a distance between the end point position of the first trajectory and a position of a pedestrian crosswalk of the lane where the target vehicle is located, where the pedestrian crosswalk is after the intersection to be passed when the target vehicle is traveling along the lane. Therefore, the end point position of the first trajectory can be determined according to the position of the pedestrian crosswalk and the distance.

The second driving parameter information of the obstacle vehicle can include second driving behavior information of the obstacle vehicle, speed information of the obstacle vehicle, start point position information or a start point position of the second trajectory corresponding to the obstacle vehicle, end point position information of the second trajectory, a trigger condition or any other driving parameter information related to the obstacle vehicle. The second driving behavior information of the obstacle vehicle may include action information of the obstacle vehicle, such as turning left, turning right, going straight ahead and making a U-turn. The start point position information of the second trajectory corresponding to the obstacle vehicle can be used to determine the start point position of the second trajectory corresponding to the obstacle vehicle. For example, the start point position information can be a distance between the start point position of the second trajectory and a position of a stop line of the lane where the obstacle vehicle is located, where the stop line is before the intersection to be passed when the target vehicle is traveling along the line. Therefore, according to the position of the stop line and the distance, the start point position of the second trajectory can be determined. The end point position information of the second trajectory corresponding to the obstacle vehicle can be used to determine an end point position of the second trajectory corresponding to the obstacle vehicle. For example, the end point position information may be a distance between the end point position of the second trajectory and a position of a pedestrian crosswalk of the lane where the obstacle vehicle is located, where the pedestrian crosswalk is after the intersection to be passed when the obstacle vehicle is traveling along the lane. Therefore, the end point position of the second trajectory can be determined according to the location of the pedestrian crosswalk and the distance. The trigger condition refers to a condition that triggers the obstacle vehicle to start moving. For example, the trigger condition can be that the color of the traffic light corresponding to the allowed traveling direction of the lane where the obstacle vehicle is located is green, such that when the color of the traffic light corresponding to the allowed traveling direction of the lane where the obstacle vehicle is located is green, the obstacle car starts to move.

In block 102, the first trajectory corresponding to the target vehicle is generated based on the first driving parameter information and the traffic element information.

In an example, after the traffic element information related to the intersections and the first driving parameter information of the target vehicle contained in the map to be processed are obtained, the first trajectory corresponding to the target vehicle is generated according to the first driving parameter information and the traffic element information of the target vehicle. In an example, when the traffic element information refers to the traffic element information related to all intersections contained in the whole map, the first trajectory corresponding to the target vehicle throughout the map is generated. In another example, when the traffic element information refers to the traffic element information related to a preset region of the map, the first trajectory corresponding to the target vehicle within the preset region is generated.

In block 103, a second trajectory corresponding to the obstacle vehicle is generated based on the second driving parameter information and the traffic element information."

In an example, when the traffic element information refers to the traffic element information related to all intersections contained in the whole map, the second trajectory corresponding to the target vehicle throughout the map is generated. In another example, when the traffic element information refers to the traffic element information related to a preset region of the map, the second trajectory corresponding to the target vehicle within the preset region is generated There may be one or more obstacle vehicles. The number of obstacle vehicles may be set as required, which is not limited in the disclosure.

In an example, when there is one obstacle vehicle, the second trajectory corresponding to the obstacle vehicle may be generated based on the second driving parameter information of the obstacle vehicle and the traffic element information.

When there are two or more obstacle vehicles, the second trajectories corresponding to these obstacle vehicles may be generated respectively based on the second driving parameter information of respective obstacle vehicles.

The blocks 102 and 103 may be performed simultaneously, or the block 102 may be performed before the block 103, or the block 103 may be performed before the block 102. The execution order of blocks 102 and 103 is not limited in the disclosure.

In block 104, a simulation scene is generated based on the first trajectory, the second trajectory, the first driving parameter information, the second driving parameter information, and the traffic element information.

In an example, a scene file format of the simulation scene of the intersections can be determined, and scene information of the simulation scene of the intersections is obtained based on the first trajectory, the second trajectory, the first driving parameter information such as the speed of the target vehicle, the second driving parameter information such as the trigger condition and the speed of the obstacle vehicle, and the traffic element information. According to the scene information and the scene file format, the simulation scene having the scene file format is generated automatically.

With the method for generating a simulation scene according to the disclosure, the traffic element information related to the intersections contained in the map to be processed, the first driving parameter information of the target vehicle, and the second driving parameter information of the obstacle vehicle are obtained. The first trajectory corresponding to the target vehicle is generated based on the first driving parameter information and the traffic element information. The second trajectory corresponding to the obstacle vehicle is generated based on the second driving parameter information and the traffic element information. The simulation scene is generated based on the first trajectory, the second trajectory, the first driving parameter information, the second driving parameter information, and the traffic element information. In this way, the simulation scene of the intersections can be generated automatically and efficiently according to the traffic element information related to the intersections contained in the map to be processed, the first driving parameter information of the target vehicle and the second driving parameter information of the obstacle vehicle, which saves a lot of labor and saves time cost, and improves the coverage of the scene.

It can be known from the above analysis that in the disclosure, the first trajectory corresponding to the target vehicle is generated based on the first driving parameter information of the target vehicle and the traffic element information related to the intersections contained in the map to be processed, and the second trajectory corresponding to the obstacle vehicle is generated based on the second driving parameter information of the obstacle vehicle and the traffic element information.

Figure 2:
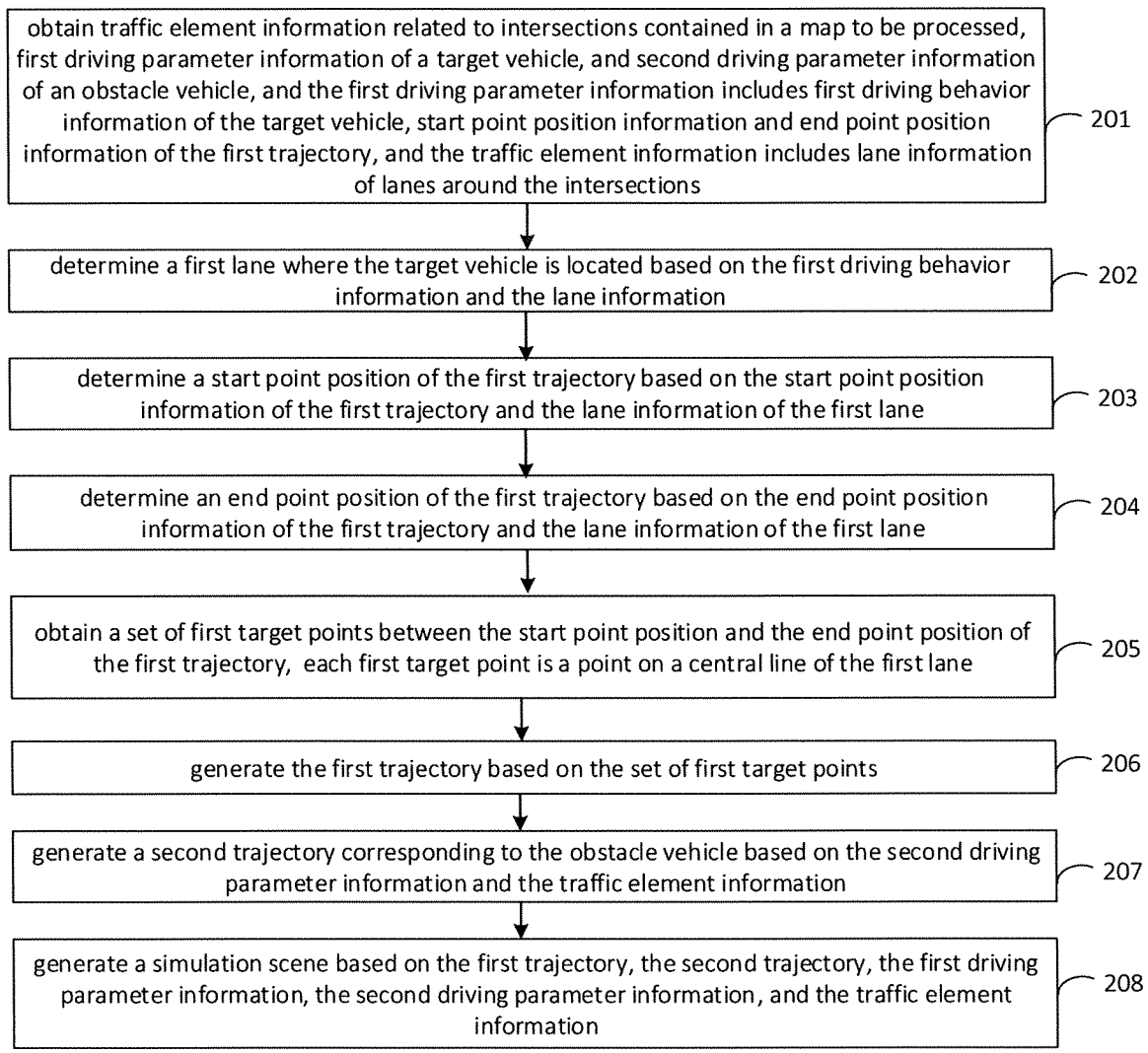
FIG. 2 is a flowchart illustrating a method for generating a simulation scene according to a second embodiment of the disclosure.

In combination with FIG. 2, in the method for generating a simulation scene according to the disclosure, the process of generating the first trajectory corresponding to the target vehicle and the process of generating the second trajectory corresponding to the obstacle vehicle will be further described.

FIG. 2 is a schematic flowchart illustrating a method for generating a simulation scene according to a second embodiment of the disclosure. As illustrated in FIG. 2, the method for generating a simulation scene may include the following.

In block 201, traffic element information related to intersections contained in a map to be processed, first driving parameter information of a target vehicle, and second driving parameter information of an obstacle vehicle are obtained. The first driving parameter information includes first driving behavior information of the target vehicle, start point position information and end point position information of a first trajectory. The traffic element information includes lane information of lanes around the intersections.

In the disclosure, the first driving parameter information of the target vehicle and the second driving parameter information of the obstacle vehicle may be defined by the user as required.

For the relevant description of the foregoing block 201, reference may be made to the foregoing embodiments, which will not be repeated here.

In block 202, a first lane where the target vehicle is located is determined based on the first driving behavior information and the lane information.

In an example, the first lane in which the target vehicle is located is determined by matching the first driving behavior information of the target vehicle with the lane information.

For example, assuming that the first driving behavior information of the target vehicle includes a turning left action of the target vehicle, the generating apparatus can obtain a lane that allows the vehicle to turn left from the map to be processed by matching the turning left action of the target vehicle with the lane information, and determine the lane as the first lane where the target vehicle is located.

In block 203, a start point position of the first trajectory is determined based on the start point position information of the first trajectory and the lane information of the first lane.

The start point position information of the first trajectory may be a distance between the start point position and a first preset position on the first lane where the target vehicle is located. For example, the start point position information of the first trajectory may be a distance between the start point position and a position of a stop line of the first lane where the target vehicle is located, where the target vehicle passes the stop line before the intersection when the target vehicle is traveling along the lane.

In an example, taking that the start point position information of the first trajectory is the distance between the start point position and the position of the stop line on the first lane where the target vehicle is located as an example, after the generating apparatus determines the first lane where the target vehicle is located, the generating apparatus can obtain the lane information of the first lane based on the traffic element information related to the intersections in the map, and determine the position of the stop line on the first lane based on the lane information of the first lane. The start point position of the first trajectory is determined according to the position of the stop line on the first lane and the distance between the start point position of the first trajectory and the position of the stop line of the first lane.

In block 204, an end point position of the first trajectory is determined based on the end point position information of the first trajectory and the lane information of the first lane.

The end point position information of the first trajectory may be a distance between the end point position and a second preset position of the first lane where the target vehicle is located. For example, the end point position information of the first trajectory may be the distance between the end point position and a position of a pedestrian crosswalk of the first lane where the target vehicle is located, where the target vehicle passes the pedestrian crosswalk after the intersection when the target vehicle along the first lane.

In an example, taking that the end point position information of the first trajectory is the distance between the end point position and the position of the pedestrian crosswalk on the first lane where the target vehicle is located as an example, after determining the first lane where the target vehicle is located, the generating apparatus can obtain the lane information of the first lane according to the traffic element information related to the intersections in the map, and determine the position of the pedestrian crosswalk on the first lane according to the lane information of the first lane. The end point position of the first trajectory is determined according to the position of the pedestrian crosswalk on the first lane and the distance between the end position of the first trajectory and the position of the pedestrian crosswalk on the first lane where the target vehicle is located.

In block 205, a set of first target points between the start point position and the end point position of the first trajectory is obtained. Each first target point is a point on a central line of the first lane.

In block 206, the first trajectory is generated based on the set of first target points.

In an example, after the first lane, the start point position of the first trajectory, and the end point position of the first trajectory are determined, the set of first target points between the start point position and the end point position of the first trajectory can be obtained, where each first target point is a point on the central line of the first lane. Further, the first trajectory is generated based on the set of first target points.

With the above-mentioned process, according to the first driving behavior information defined by the user, the start point position information of the first trajectory, the end point position information of the first trajectory, and the lane information of lanes around the intersections in the map to be processed, the first trajectory corresponding to the target vehicle is automatically generated. This method for generating the first trajectory corresponding to the target vehicle does not need manual analysis of the details of the intersections one by one, but needs a small amount of semantic-level definition parameters of the target vehicle provided by the user, such that the trajectories of the target vehicle at the intersections that meet the user's intentions can be quickly generated in batches in a short period of time, which improves the efficiency of scene generation and saves labor costs.

In block 207, a second trajectory corresponding to the obstacle vehicle is generated based on the second driving parameter information and the traffic element information.

In an example, the second driving parameter information of the obstacle vehicle may be defined by the user as required. The second driving parameter information may include the second driving behavior information of the obstacle vehicle, the start point position information and the end point position information of the second trajectory.

In an example, like the process of generating the first trajectory corresponding to the target vehicle according to the first driving parameter information and the traffic element information, the second trajectory corresponding to the obstacle vehicle can be generated in the following manner.

A second lane where the obstacle vehicle is located is determined based on the second driving behavior information and the lane information. A start point position of the second trajectory is determined based on the start point position information of the second trajectory and the lane information of the second lane. An end point position of the second trajectory is determined based on the end point position information of the second trajectory and the lane information of the second lane. A set of second target points between the start point position and the end point position of the second trajectory is obtained, where each second target point is a point on a central line of the second lane. The second trajectory is generated based on the set of second target points.

The start point position information of the second trajectory may be the distance between the start point position and a third preset position of the second lane where the obstacle vehicle is located. For example, the start point position information of the second trajectory may be a distance between the start point position and a position of a stop line of the second lane where the obstacle vehicle is located, where the obstacle target passes the stop line before the intersection when the obstacle vehicle is traveling along the lane where the obstacle vehicle is located.

The end position information of the second trajectory may be a distance between the end point position and a fourth preset position of the second lane where the obstacle vehicle is located. For example, the end point position information of the second trajectory may be the distance between the end point position and the position of a pedestrian crosswalk on the second lane where the obstacle vehicle is located, where the obstacle vehicle passes the pedestrian crosswalk is after the intersection when the obstacle vehicle is traveling along the second lane.

In an example, taking that the start point position information of the second trajectory is the distance between the start point position and the position of the stop line of the second lane where the obstacle vehicle is located, and the end point position information of the second trajectory is the distance between the end position and the position of the pedestrian crosswalk on the second lane where the obstacle vehicle is located as an example, after the generating apparatus determines the second lane where the obstacle vehicle is located by matching the second driving behavior information of the obstacle vehicle with the lane information, the generating apparatus obtains the lane information of the second lane according to the traffic element information related to the intersections in the map, determines the position of the stop line and the position of the pedestrian crosswalk on the second lane according to the lane information of the second lane, determines the start point position according to the position of the stop line on the second lane and the distance between the start point position of the second trajectory and the position of the stop line of the second lane, and determine the end point position of the second trajectory according to the position of the pedestrian crosswalk on the second lane and the distance between the end point position of the second trajectory and the position of the pedestrian crosswalk of the second lane.

After determining the second lane, the start point position of the second trajectory, and the end point position of the second trajectory, the set of second target points between the start point position and the end point position of the second trajectory is obtained, where each second target point is a point on the central line of the second lane. The second trajectory is generated based on the set of second target points.

With the above-mentioned process, according to the second driving behavior information defined by the user, the start point position information of the second trajectory, the end point position information of the second trajectory, and the lane information of lanes around the intersections in the map to be processed, the second trajectory corresponding to the obstacle vehicle is automatically generated. This method for generating the second trajectory corresponding to the obstacle vehicle does not need manual analysis of the details of the intersections one by one, but needs a small amount of semantic-level definition parameters of the obstacle vehicle provided by the user. The trajectories of the obstacle vehicle at the intersections that meet the user's intention can be quickly generated in batches in a short time, which improves the efficiency of scene generation and saves labor costs.

In block 208, a simulation scene is generated based on the first trajectory, the second trajectory, the first driving parameter information, the second driving parameter information, and the traffic element information.

For the specific implementation process and principle of the block 208, reference may be made to the description of the above embodiments, and details are not repeated here.

It is understandable that, in practical applications, there are often situations where one lane allows multiple traveling directions. For example, one lane allows both a direction of turning left and a direction of going straight ahead. In the disclosure, when the second lane where the obstacle vehicle is located allows multiple traveling directions, for each traveling direction, a respective second trajectory corresponding to the corresponding traveling direction may be generated.

That is, in generating the second trajectory corresponding to the obstacle vehicle, after the second lane where the obstacle vehicle is located is determined according to the second driving behavior information and the lane information, if the second lane allows multiple traveling directions, the start point position of the second trajectory can be determined according to the start point position information of the second trajectory and the lane information of the second lane; and the end point position of the second trajectory corresponding to each traveling direction is determined respectively according to the end point position information of the second trajectory and the lane information of the second lane. For each traveling direction, the set of second target points between the start point position of the second trajectory and the end point position of the second trajectory corresponding to the traveling direction is obtained. The second target point is a point on the central line of the second lane corresponding to the traveling direction, The second trajectory corresponding to the traveling direction is generated according to the set of second target points between the start point position of the second trajectory and the end point position of the second trajectory corresponding to the traveling direction.

For example, it is assumed that the start point position information of the second trajectory is the distance a between the start point position and the position of the stop line of the second lane where the obstacle vehicle is located. The stop line is the one passed by the obstacle vehicle before the intersection when the obstacle vehicle is traveling along its lane. The end point position information of the second trajectory is a distance b between the end point position and the position of the pedestrian crosswalk of the second lane where the obstacle vehicle is located, where the pedestrian crosswalk is the one passed by the obstacle vehicle after the intersection when the obstacle vehicle is traveling along the second lane.

Assuming that after the second lane where the obstacle vehicle is located is determined according to the second driving behavior information and the lane information, it is determined that the second lane is allowed both the direction of turning left and the direction of going straight ahead. According to the distance a and the position of the stop line on the second lane, the start point position A of the second trajectory is determined. According to the distance b and the position of the pedestrian crosswalk to be passed by the obstacle vehicle after the obstacle vehicle turns left along the second lane and passes the intersection, the end point position B1 of the second trajectory corresponding to the direction of turning left is determined. According to the distance b and the position of the pedestrian crosswalk to be passed by the obstacle vehicle after the obstacle vehicle goes straight ahead along the second lane and passes the intersection, an end point position B2 of the second trajectory corresponding to the direction of going straight ahead is determined.

For the direction of turning left, the set of the second target points between the start point position A of the second trajectory and the end point position B1 of the second trajectory corresponding to the direction of turning left is obtained. Each second target point is a point on the central line of the second lane corresponding to the direction of turning left. The second trajectory in the direction of turning left is generated according to the set of second target points between the start point position A of the second trajectory and the end point position B1 of the second trajectory corresponding to the direction of turning left.

For the direction of going straight ahead, the set of second target points between the start point position A of the second trajectory and the end point position B2 of the second trajectory corresponding to the direction of going straight ahead is obtained. Each second target point is a point on the central line of the second lane corresponding to the direction of going straight ahead. The second trajectory corresponding to the direction of going straight ahead is generated according to the set of second target points between the start point position A of the second trajectory and the end point position B2 of the second trajectory corresponding to the direction of going straight ahead.

After the second trajectory corresponding to each traveling direction is generated in the case that one second lane allows different traveling directions, the simulation scene corresponding to each traveling direction is generated based on the first trajectory corresponding to the target vehicle, the second trajectory corresponding to each traveling direction, the first driving parameter information, the second driving parameter information and the traffic element information.

For example, the second lane where the obstacle vehicle is located allows both the direction of turning left and the direction of going straight ahead, and the second trajectory corresponding to the direction of turning left and the second trajectory corresponding to the direction of going straight ahead are generated. The simulation scene corresponding to the direction of turning left of the obstacle vehicle is generated according to the first trajectory corresponding to the target vehicle, the second trajectory corresponding to the obstacle vehicle in the direction of turning left, the first driving parameter information, the second driving parameter information and the traffic element information. The simulation scene corresponding to the direction of going straight ahead of the obstacle vehicle is generated according to the first trajectory corresponding to the target vehicle, the second trajectory corresponding to the obstacle vehicle in the direction of going straight ahead, the first driving parameter information, the second driving parameter information and the traffic element information.

When multiple traveling directions are allowed by one second lane, for each traveling direction, the second trajectory corresponding to the traveling direction is generated. According to the first trajectory corresponding to the target vehicle and the second trajectory corresponding to each traveling direction, the first driving parameter information, the second driving parameter information and the traffic element information, a respective simulation scene corresponding to each traveling direction is generated, which improves the coverage of the simulation scene of the intersections.

In an example, the traffic element information may include initial state information of the traffic light. The user may define the simulation state of the traffic light as required, such that the simulation scene is generated according to the user-defined simulation state of the traffic light. In addition, the user can define traveling parameter information, such as the speed of pedestrians or the trigger condition, as required, such that the simulation scene is generated according to the user-defined pedestrian traveling parameter information of pedestrians.

That is, the block 208 can be implemented in the following manner.

According to fourth configuration information from the user, the traveling parameter information of the pedestrians and the control information of the traffic light are obtained. According to the control information, the initial state information is adjusted to obtain the simulation state information of the traffic light. The simulation scene is generated according to the first trajectory, the second trajectory, the first driving parameter information, the second driving parameter information, the traveling parameter information of the pedestrians, and the simulation state information.

The fourth configuration information is information about elements such as pedestrians and traffic lights that are configured by the user as required.

The pedestrian refers to walkers and riders. The traveling parameter information of the pedestrians may include the speed of the pedestrians and the trigger condition of the pedestrians. The trigger condition of the pedestrians refers to a condition that triggers the pedestrians to start moving. For example, the trigger condition can be that the color of the traffic light corresponding to the allowed traveling direction of the lane where one or more pedestrians are located is green. Therefore, when the color of the traffic light corresponding to the allowed traveling direction of the lane where one or more pedestrians are located is green, the one or more pedestrians begin to move.

The control information of the traffic light may include such as the direction indicated by the traffic light, the color of the traffic light, and the duration of a traffic signal output by the traffic light.

In an example, after obtaining the control information of the traffic light, the initial state information of the traffic light can be adjusted according to the control information, to obtain the simulation state information of the traffic light. The simulation scene is generated according to the first trajectory, the second trajectory, the first driving parameter information, the second driving parameter information, the traveling parameter information of the pedestrians and the simulation state information.

The traveling parameter information of the pedestrians and the control information of the traffic light are obtained according to the fourth configuration information from the user. The initial state information is adjusted according to the control information, to obtain the simulation state information of the traffic light. The simulation scene is generated according to the first trajectory, the second trajectory, the first driving parameter information, the second driving parameter information, the traveling parameter information of the pedestrians and the simulation state information, realizing the generation of more complex simulation scene of the intersections according to the state of the traffic light and the traveling parameters of the pedestrians, which improves the coverage of the simulation scene of the intersection.

Figure 3:
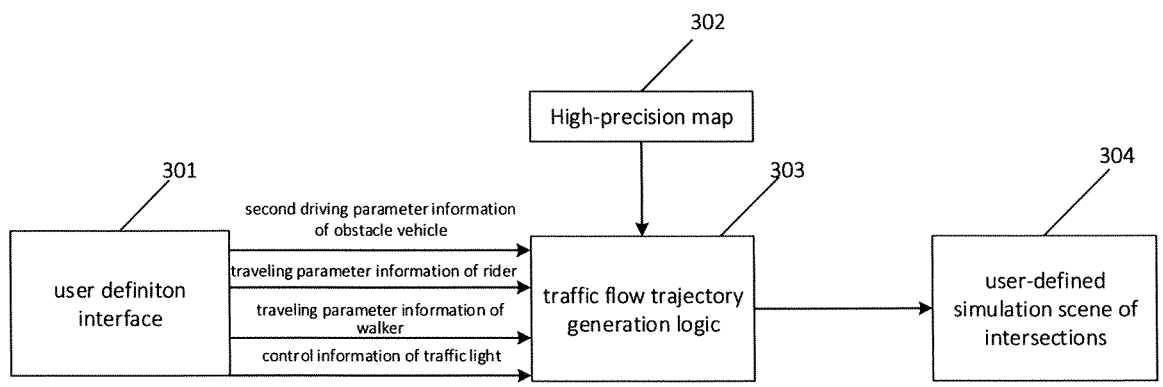
FIG. 3 is a schematic diagram illustrating an information flow of a method for generating a simulation scene according to a second embodiment of the disclosure.

As illustrated in FIG. 3 providing a schematic diagram of the information flow, in the disclosure, the generating apparatus may obtain, from a user definition interface 301, the user-defined first driving parameter information of the target vehicle (not illustrated in FIG. 3), the second driving parameter information of the obstacle vehicle, the traveling parameter information of the pedestrians such as riders and walkers, the control information of the traffic light, and obtain the traffic element information related to the intersections contained in a high-precision map 302. The first trajectory corresponding to the target vehicle and the second trajectory corresponding to the obstacle vehicle are generated according to the first driving parameter information of the target vehicle, the second driving parameter information of the obstacle vehicle, and the traffic element information related to the intersections, based on a traffic flow trajectory generation logic provided in the disclosure. The user-defined intersection simulation scene 304 is generated according to the first driving parameter information, the second driving parameter information, the first trajectory, the second trajectory, the pedestrian traveling parameter information of pedestrians such as riders and walkers, and the control information of the traffic light.

With the method for generating a simulation scene according to the disclosure, the traffic element information related to the intersections in the map to be processed, the first driving parameter information of the target vehicle and the second driving parameter information of the obstacle vehicle are obtained. The first driving parameter information includes first driving behavior information of the target vehicle, the start point position information and the end point position information of the first trajectory. The traffic element information includes lane information of lanes around the intersections. The first lane where the target vehicle is located is determined based on the first driving behavior information and the lane information. The start point position of the first trajectory is determined based on the start point position information of the first trajectory and the lane information of the first lane. The end point position of the first trajectory is determined based on the end point position information of the first trajectory and the lane information of the first lane. The set of first target points between the start point position and the end point position of the first trajectory is obtained, and each first target point is a point on the central line of the first lane. The first trajectory is generated based on the set of first target points. The second trajectory corresponding to the obstacle vehicle is generated based on the second driving parameter information and the traffic element information. The simulation scene is generated according to the first trajectory, the second trajectory, the first driving parameter information, the second driving parameter information and the traffic element information. Thus, according to the traffic element information related to the intersections in the map to be processed, the automatic and efficient generation of the simulation scene of the intersections based on the user-defined first driving parameter information of the target vehicle and the user-defined second driving parameter information of the obstacle vehicle is realized, which saves a lot of labor and saves time cost, and improves the coverage of the scene.

It can be known from the above analysis that in the disclosure, the second trajectory corresponding to the obstacle vehicle can be generated according to the second driving parameter information of the obstacle vehicle that is defined by the user. In a possible implementation, the second trajectory corresponding to the obstacle vehicle can be generated based on the real traffic flow. The process of generating the second trajectory corresponding to the obstacle vehicle in the method for generating a simulation scene of the disclosure will be further described below with reference to FIG. 4.

Figure 4:
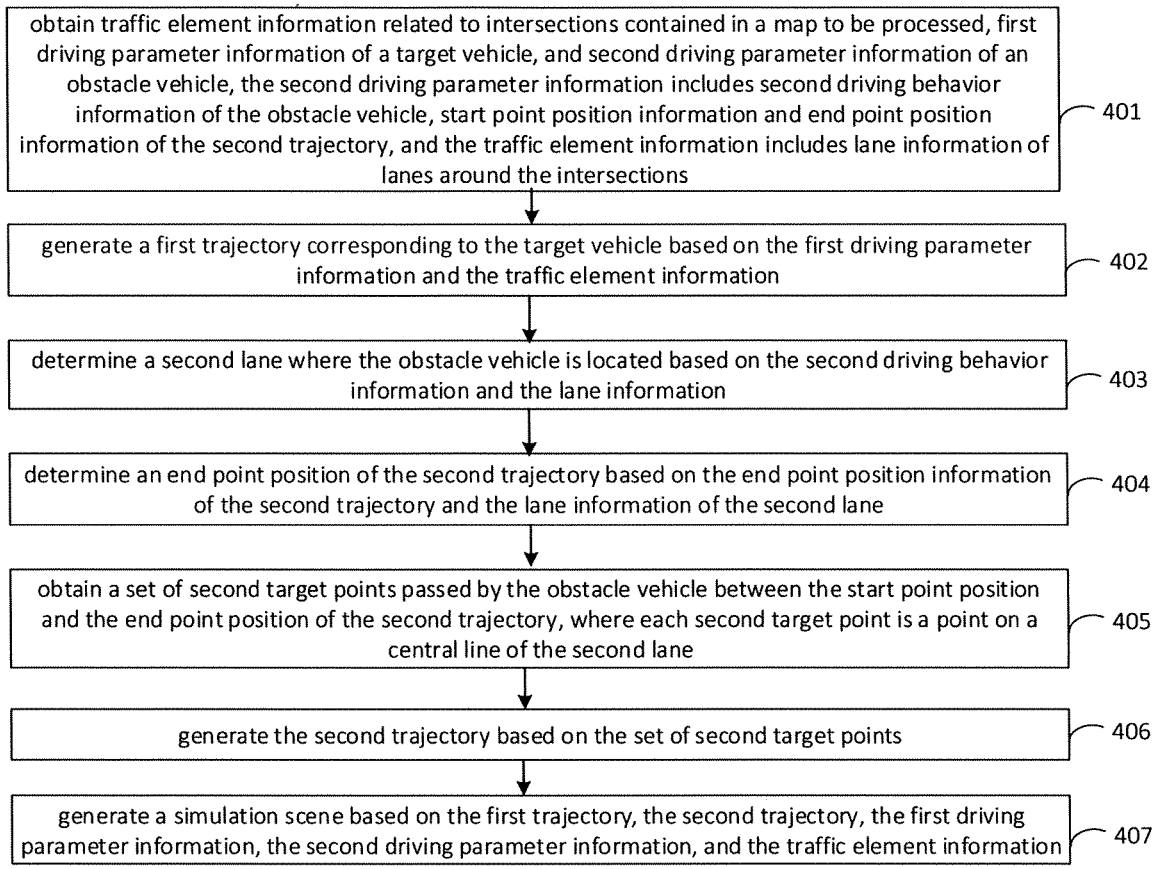
FIG. 4 is a flowchart illustrating a method for generating a simulation scene according to a third embodiment of the disclosure.

FIG. 4 is a flowchart illustrating a method for generating a simulation scene according to a third embodiment of the disclosure. As illustrated in FIG. 4, the method for generating a simulation scene may include the following.

In block 401, traffic element information related to intersections contained in a map to be processed, first driving parameter information of a target vehicle, and second driving parameter information of an obstacle vehicle are obtained. The second driving parameter information includes second driving behavior information of the obstacle vehicle, start point position information and end point position information of the second trajectory. The traffic element information includes lane information of lanes around the intersections.

For the relevant description of the block 401, reference may be made to the above-mentioned embodiments, which will not be repeated here.

In block 402, a first trajectory corresponding to the target vehicle is generated based on the first driving parameter information and the traffic element information.

In the disclosure, the first driving parameter information of the target vehicle may be defined by the user as required, and the second driving parameter information of the obstacle vehicle may be obtained based on the real traffic flow.

The first driving parameter information includes first driving behavior information of the target vehicle, the start point position information and the end point position information of the first trajectory. The method for generating the first trajectory corresponding to the target vehicle according to the first driving parameter information of the target vehicle and the traffic element information, may refer to the above-mentioned embodiments, which will not be repeated here.

In an example, the second driving parameter information of the obstacle vehicle can be obtained based on the real traffic flow by the following method.

According to the third configuration information from the user, a target scene complexity degree and the end point position information of the second trajectory are determined. According to the correspondence between scene complexity degrees and state information of scenes, a target scene state information corresponding to the target scene complexity degree is determined. The initial position and the speed of the obstacle vehicle are obtained from the target scene state information. The second driving behavior information of the obstacle vehicle is determined according to the initial position, the speed of the obstacle vehicle and the lane information. The initial position of the obstacle vehicle is determined as the start point position of the second trajectory.

The third configuration information is about the scene complexity degree and the end point position of the second trajectory configured by the user as required. It is to be noted that the end point position information of the second trajectory may be configured by a user or can be a default value generated by the generating apparatus, which is not limited in the disclosure.

The scene complexity degree is configured to characterize the complexity degree of the traffic flow at the intersections in the scene. The complexity degree is related to the type of traffic participants, the number of the traffic participants and an average speed of the traffic participants. The scene state information includes the number, the speeds, and the positions of various types of traffic participants in the scene.

It is understandable that the scene state information is to describe the number, the speeds, and the positions of various types of traffic participants shown in the scene. In the disclosure, the initial position and the speed of the obstacle vehicle obtained from the scene state information are determined as the initial state of the obstacle vehicle, and the obstacle vehicle is controlled to continue driving based on the initial state in the simulation scene.

In an example, the correspondence between the scene complexity degrees and the scene state information can be preset, such that after the target scene complexity degree is determined according to the third configuration information from the user, the target scene state information corresponding to the target scene complexity degree can be determined according to the correspondence between the scene complexity degrees and the scene state information. The initial position and the speed of the obstacle vehicle can be obtained from the target scene state information.

In an example, the correspondence between the scene complexity degrees and the scene state information may be represented by a complexity degree function shown in the following formula (1). The complexity degree function is a function of the type of traffic participants, the number of traffic participants and the average speed of traffic participants:

$$F(t) = \frac{Q_1 * V_1 * \eta_1 + Q_2 * V_2 * \eta_2 + Q_3 * V_2 * \eta_3}{Q_1 + Q_2 + Q_3} \qquad (1)$$

where, F(t) represents the scene complexity degree; Q1, Q2, and Q3 represent the number of obstacle vehicles, the number of pedestrians, and the number of riders at the intersection, respectively; V1, V2, and V3 represent the average speed of obstacle vehicles, the average speed of pedestrians and the average speed of riders, respectively; and η1, η2, and η3 represent the weighted value of obstacle vehicle contributing to the scene complexity degree, the weighted value of pedestrian contributing to the scene complexity degree, and the weighted value of rider contributing to the scene complexity degree, respectively. The weighted values can be set as required. For example, η1=0.6, η2=0.2, η3=0.2.

In an example, after determining the target scene complexity degree according to the third configuration information from the user, the type of traffic participants, the number of traffic participants, and the average speed of traffic participants that match the target scene complexity degree can be determined based on the complexity degree function shown in formula (1), and the target scene state information corresponding to the target scene complexity degree is obtained. The initial position and the speed of the obstacle vehicle are obtained from the target scene state information. The initial position of the obstacle vehicle may include, for example, a position coordinate of the obstacle vehicle and an identifier of the lane where the obstacle vehicle is located in the real traffic flow.

Further, after obtaining the initial position and the speed of the obstacle vehicle, the intention of the obstacle vehicle can be determined according to the initial position of the obstacle vehicle, the speed of the obstacle vehicle, and the lane information of lanes around the intersections, to determine the second driving behavior information of the obstacle vehicle. The initial position of the obstacle vehicle is determined as the start point position of the second trajectory.

For example, each lane in the map is provided with a corresponding identifier. The identifier of the lane where the obstacle vehicle is located obtained from the target scene state information is C, the initial position coordinate obtained from the target scene state information is (x, y), and the speed obtained from the target scene state information is not 0. Assuming that it is determined that the lane with the identifier C is a turning left lane by matching the identifier C with preset identifiers of lanes, in combination with the speed of the obstacle vehicle not being 0, it can be determined that the obstacle vehicle is about to turn left, the second driving behavior information of the obstacle vehicle includes the turning left action of the obstacle vehicle, and the coordinate (x, y) is the start point position of the obstacle vehicle.

In block 403, a second lane where the obstacle vehicle is located is determined based on the second driving behavior information and the lane information.

In an example, the second driving behavior information of the obstacle vehicle may be matched with the lane information, to determine the second lane in which the obstacle vehicle is located.

In block 404, an end point position of the second trajectory is determined based on the end point position information of the second trajectory and the lane information of the second lane.

The end point position information of the second trajectory may be the distance between the end point position and the fourth preset position of the second lane where the obstacle vehicle is located. For example, the end point position information of the second trajectory may be the distance between the end point position and the position of the pedestrian crosswalk of the second lane where the obstacle vehicle is located, where the pedestrian crosswalk is to be passed by the obstacle vehicle after the intersection when the obstacle vehicle is traveling along the second lane.

In an example, taking that the end point position information of the second trajectory is the distance between the end point position and the position of the pedestrian crosswalk of the second lane where the obstacle vehicle is located as an example, the generating apparatus determines the second lane where the obstacle vehicle is located, obtains the lane information of the second lane according to the traffic element information related to the intersections in the map, determines the position of the pedestrian crosswalk of the second lane according to the lane information of the second lane, and determines the end point position of the second trajectory based on the position of the pedestrian crosswalk of the second lane and the distance between the end point position of the second trajectory and the position of the pedestrian crosswalk of the second lane where the obstacle vehicle is located.

In block 405, a set of second target points between the start point position and the end point position of the second trajectory is obtained, where each second target point is a point on the central line of the second lane.

In block 406, the second trajectory is generated based on the set of second target points.

In an example, after the second lane, the start point position of the second trajectory, and the end point position of the second trajectory are determined, the set of second target points between the start point position and the end point position of the second trajectory is obtained, where each second target point is a point on a central line of the second lane. The second trajectory is generated based on the set of second target points.

With the above method, it is possible to obtain the second driving behavior information of the obstacle vehicle, the end point position information of the second trajectory, and the start point position of the second trajectory based on the third configuration information from the user and the real traffic flow. Further, the second trajectory corresponding to the obstacle vehicle can be automatically generated according to the second driving behavior information, the start point position and the end point position information of the second trajectory, and the lane information of lanes around the intersections in the map to be processed. The method for generating the second trajectory corresponding to the obstacle vehicle does not need to manually analyze the details of the intersections one by one. As long as the user provides a small amount of semantic-level scene complexity degrees, the trajectories of the obstacle vehicle at intersections that meet the user's intentions can be quickly generated in batches in a short period of time, which improves the efficiency of scene generation and saves the labor costs.

In an example, the second trajectory corresponding to the obstacle vehicle can be generated according to the second driving parameter information defined by the user as required, or the second trajectory corresponding to the obstacle vehicle can be obtained based on the real traffic flow. For example, with the user definitions, more attention is paid to the action type of the obstacle vehicle, and an infinite number of second trajectories corresponding to the obstacle vehicle can be generated theoretically, which is suitable for the iteration and verification stage of the automatic driving algorithm. Based on the real traffic flow, more attention is paid on the density and complexity degree of the traffic flow at the intersections, which is suitable for the launching stage of the automatic driving product. In practical applications, the method for generating the second trajectory corresponding to the obstacle vehicle can be flexibly selected according to the stage of the automatic driving product.

In block 407, the simulation scene is generated based on the first trajectory, the second trajectory, the first driving parameter information, the second driving parameter information, and the traffic element information.

It is understandable that, in practical applications, it is possible that one lane allows multiple traveling directions. For example, one lane allows both the direction of turning left and the direction of going straight ahead. In the disclosure, when the second lane where the obstacle vehicle is located allows multiple traveling directions, for each traveling direction, a second trajectory corresponding to the traveling direction may be generated.

That is, in generating the second trajectory corresponding to the obstacle vehicle, after the second lane where the obstacle vehicle is located is determined according to the second driving behavior information and the lane information, if the second lane allows multiple traveling directions, the start point position of the second trajectory can be determined according to the start point position information of the second trajectory and the lane information of the second lane, and the end point position of the second trajectory corresponding to each traveling direction can be determined according to the end point position information of the second trajectory and the lane information of the second lane. For each traveling direction, a set of second target points between the start point position of the second trajectory and the end point position of the second trajectory corresponding to the traveling direction is obtained. Each second target point is a point on the central line of the second lane. The second trajectory corresponding to the traveling direction is generated according to the set of second target points between the start point position of the second trajectory and the end point position of the second trajectory corresponding to the traveling direction. Further, after the second trajectories corresponding to the plurality of traveling directions are respectively generated for different traveling directions allowed by the second lane, the simulation scene corresponding to each traveling direction can be generated based on the first trajectory corresponding to the target vehicle, the second trajectory corresponding to each traveling direction, the first driving parameter information, the second driving parameter information and the traffic element information.

It is understandable that, in a possible situation, it is possible that the second trajectory corresponding to the obstacle vehicle is not intersected with the first trajectory corresponding to the target vehicle. The second trajectory which is not intersected with the first trajectory corresponding to the target vehicle, is meaningless for the automatic driving simulation of the target vehicle. In the disclosure, in order to simplify the generated simulation scene of intersections and improve the generation efficiency of the simulation scene of intersections, one or more third trajectories intersected with the first trajectory can be obtained from at least one second trajectory, and one or more simulation scenes are generated according to the first trajectory corresponding to the target vehicle, the one or more third trajectories intersected with the first trajectory, the first driving parameter information, the second driving parameter information, and the traffic element information.

In addition, there may generate one or more first trajectories corresponding to the target vehicle according to the method of the disclosure. When the target vehicle corresponds to one first trajectory, the one or more simulation scenes corresponding to the first trajectory can be generated according to the first trajectory corresponding to the target vehicle, the one or more third trajectories intersected with the first trajectory, the first driving parameter information, the second driving parameter information and the traffic element information. When the target vehicle corresponds to two or more first trajectories, for each first trajectory, one or more simulation scenes corresponding to the first trajectory is generated according to the first trajectory, the one or more third trajectories intersected with the first trajectory, the first driving parameter information, the second driving parameter information and the traffic element information.

It is to be noted that, in the disclosure, when one obstacle vehicle corresponds to multiple third trajectories, different simulation scenes are generated according to the plurality of third trajectories respectively.

That is, in block 407, from at least one second trajectory, one or more third trajectories intersected with the first trajectory is obtained. The simulation scene corresponding to the first trajectory is generated based on the first trajectory, the one or more third trajectories intersected with the first trajectory, the first driving parameter information, the second driving parameter information, and the traffic element information.

For example, it is assumed that both a trajectory D and a trajectory E correspond to the target vehicle m, trajectories F, G, H, and I correspond to the obstacle vehicle n1, and trajectories J and K correspond to the obstacle vehicle n2. The trajectories F and G corresponding to the obstacle vehicle n1 are intersected with the trajectory D corresponding to the target vehicle m, the trajectory H corresponding to the obstacle vehicle n1 is intersected with the trajectory E corresponding to the target vehicle n, the trajectory I corresponding to the obstacle vehicle n1 is not intersected with the trajectory D or the trajectory E corresponding to the target vehicle m, the trajectory J corresponding to the obstacle vehicle n2 is intersected with the trajectory D corresponding to the target vehicle m, and the trajectory K corresponding to the obstacle vehicle n2 is not intersected with the trajectory D or the trajectory E corresponding to the target vehicle m.

In the disclosure, a simulation scene 1 corresponding to the trajectory D is generated based on the trajectory D corresponding to the target vehicle m and the corresponding first driving parameter information, the trajectory F corresponding to the obstacle vehicle n1 and the corresponding second driving parameter information, the trajectory J corresponding to the obstacle vehicle n2 and the corresponding second driving parameter information and the traffic element information. A simulation scene 2 corresponding to the trajectory D is generated based on the trajectory D corresponding to the target vehicle m and the corresponding first driving parameter information, the trajectory G corresponding to the obstacle vehicle n1 and the corresponding second driving parameter information, the trajectory J corresponding to the obstacle vehicle n2 and the corresponding second driving parameter information, and the traffic element information. A simulation scene 3 corresponding to the trajectory E is generated based on the trajectory E corresponding to the target vehicle m and the corresponding first driving parameter information, the trajectory H corresponding to the obstacle vehicle n1 and the corresponding second driving parameter information, and the traffic element information.

Figure 5:
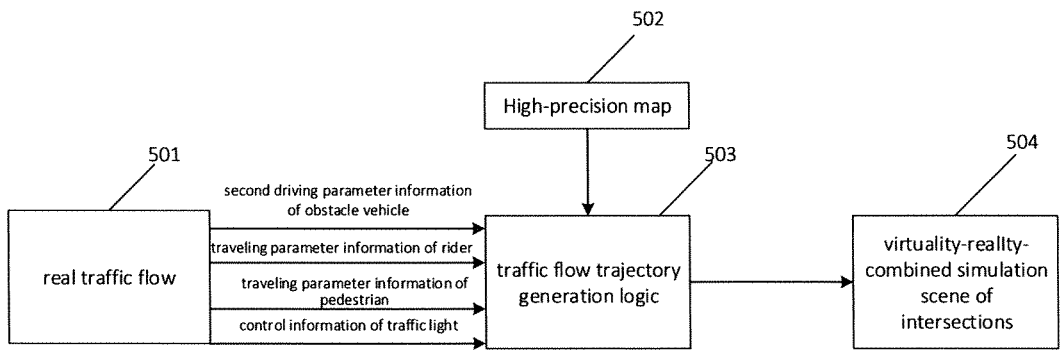
FIG. 5 is a schematic diagram illustrating an information flow of a method for generating a simulation scene according to a third embodiment of the disclosure.

As illustrated in FIG. 5 providing the schematic diagram of the information flow, in the disclosure, the generating apparatus may obtain from the user definition interface, the user-defined first driving parameter information (not illustrated in FIG. 5) of the target vehicle. The generating apparatus may obtain the second driving parameter information of the obstacle vehicle, the driving parameter information of the pedestrians such as riders and walkers, and the control information of the traffic light according to the real traffic flow 501, and obtain the traffic element information related to the intersections in a high-precision map 502. According to the first driving parameter information of the target vehicle, the second driving parameter information of the obstacle vehicle, and the traffic element information related to the intersections, and based on the traffic flow trajectory generation logic in the disclosure, the first trajectory corresponding to the target vehicle and the second trajectory corresponding to the obstacle vehicle are generated. A virtuality-reality-combined intersection simulation scene 504 is generated according to the first driving parameter information, the second driving parameter information, the first trajectory, the second trajectory, the driving parameter information of the pedestrians such as riders and walkers, and the control information of the traffic light.

With the method for generating a simulation scene according to the disclosure, the traffic element information related to the intersections contained in the map to be processed, the first driving parameter information of the target vehicle, and the second driving parameter information of the obstacle vehicle are obtained. The second driving parameter information includes the second driving behavior information of the obstacle vehicle, the start point position and the end point position information of the second trajectory. The traffic element information includes lane information of lanes around the intersections. The first trajectory corresponding to the target vehicle is generated according to the first driving parameter information and the traffic element information. The second lane where the obstacle vehicle is located is determined according to the second driving behavior information and the lane information. The end point position of the second trajectory is determined according to the end point position information of the second trajectory and the lane information of the second lane. The set of second target points between the start point position of the second trajectory and the end point position of the second trajectory is obtained. Each second target point is a point on the central line of the second lane. A second trajectory is generated according to the set of second target points. A simulation scene is generated according to the first trajectory, the second trajectory, the first driving parameter information, the second driving parameter information, and the traffic element information. Therefore, according to the traffic element information related to the intersections in the map to be processed, the first driving parameter information of the target vehicle defined by the user, and the second driving parameter information of the obstacle vehicle obtained based on the real traffic flow, the simulation scene of the intersections is generated automatically, conveniently and efficiently, which saves labor costs and saves time costs, and improves coverage of the scene.

It can be known from the above analysis that in the disclosure, the simulation scene can be generated according to the first trajectory corresponding to the target vehicle, the second trajectory corresponding to the obstacle vehicle, the first driving parameter information, the second driving parameter information and the traffic element information. In a possible implementation, when there are multiple obstacle vehicles, the second trajectories corresponding to the multiple obstacle vehicles may conflict with each other. In view of the above situation, the method for generating a simulation scene according to the disclosure will be further described below with reference to FIG. 6.

Figure 6:
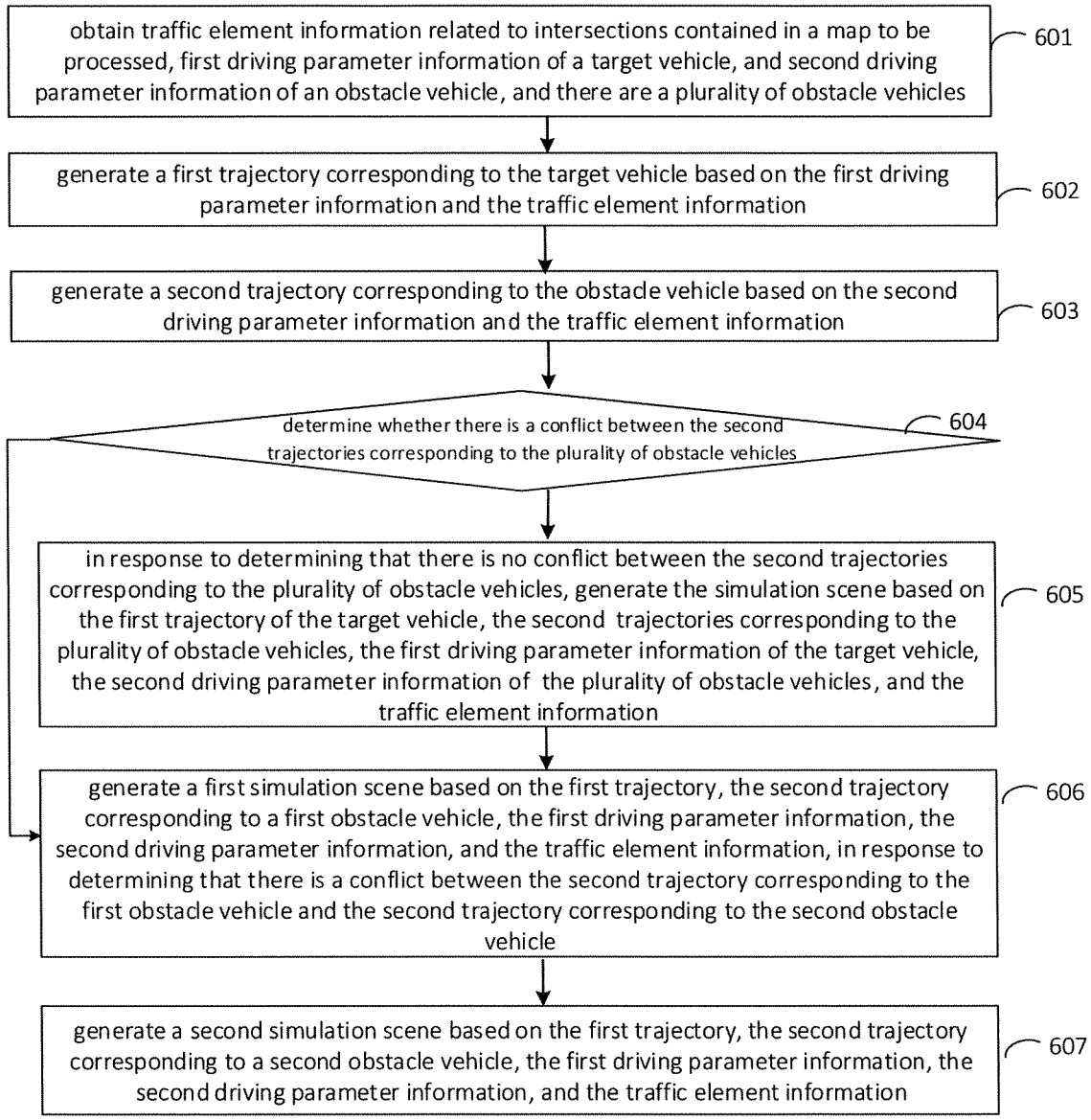
FIG. 6 is a flowchart illustrating a method for generating a simulation scene according to a fourth embodiment of the disclosure.

FIG. 6 is a schematic flowchart illustrating a method for generating a simulation scene according to a fourth embodiment of the disclosure. As illustrated in FIG. 6, the generation method for generating a simulation scene may include the following.

In block 601, traffic element information related to intersections contained in a map to be processed, first driving parameter information of a target vehicle, and second driving parameter information of an obstacle vehicle are obtained. There may be multiple obstacle vehicles.

In block 602, a first trajectory corresponding to the target vehicle is generated based on the first driving parameter information and the traffic element information.

For the specific implementation process and principles of blocks 601-602, reference may be made to the description of the above-mentioned embodiments, which will not be repeated here.

In block 603, according to the second driving parameter information of the plurality of obstacle vehicles and the traffic element information, the second trajectories corresponding to the plurality of obstacle vehicles are generated.

In an example, for each obstacle vehicle, the second trajectory corresponding to the obstacle vehicle may be generated according to the second driving parameter information of the obstacle vehicle and traffic element information. For a specific manner of generating the second trajectory corresponding to the obstacle vehicle, reference may be made to the description of the above-mentioned embodiments, which will not be repeated here.

In block 604, it is determined whether there is a conflict among the second trajectories corresponding to the plurality of obstacle vehicles. In response to determining that there is no conflict among the second trajectories corresponding to the plurality of obstacle vehicles, the block 605 is executed. In response to determining that there is a conflict between the second trajectory corresponding to a first obstacle vehicle and a second trajectory corresponding to the second obstacle vehicle, the block 606 is executed.

In an example, it can be determined whether there is a conflict among the second trajectories corresponding to the plurality of obstacle vehicles in the following manner.

When there is an intersection point among the second trajectories corresponding to the plurality of obstacle vehicles, and a time difference between the time when each two obstacle vehicles pass the intersection point is less than or equal to a preset threshold, it is determined that there is a conflict among the second trajectories corresponding to the plurality of obstacle vehicles.

When there is an intersection point between the second trajectories corresponding to the plurality of obstacle vehicles, and the time difference between the time when each two obstacle vehicles pass the intersection point is greater than the preset threshold, or when there is no intersection point between the second trajectories corresponding to the plurality of obstacle vehicles, it is determined that there is no conflict between the second trajectories corresponding to the obstacle vehicles.

For example, assuming that the preset threshold is 0.5 s, the obstacle vehicle n1 turns left at the speed of $v_1$, the obstacle vehicle n2 goes straight ahead at the speed of $v_2$, and the second trajectory corresponding to the obstacle vehicle n1 and the second trajectory corresponding to the obstacle vehicle n2 both pass a point o, a following expression is satisfied:

$$\left| \frac{MO}{v_1} - \frac{NO}{v_2} \right| \leq 0.5 \text{ s},$$

where, M is the initial point position of the second trajectory corresponding to the obstacle vehicle n1, and N is the initial point position of the second trajectory corresponding to the obstacle vehicle n2.

Since the time difference between the time when the obstacle vehicle n1 and the obstacle vehicle n2 pass the intersection point is less than or equal to the preset threshold 0.5 s, it can be determined that there is no conflict between the second trajectory corresponding to the obstacle vehicle n1 and the second trajectory corresponding to the obstacle vehicle n2.

In block 605, the simulation scene is generated according to the first trajectory corresponding to the target vehicle, the second trajectories respectively corresponding to the plurality of obstacle vehicles, the first driving parameter information of the target vehicle, the second driving parameter information of the plurality of obstacle vehicles and the traffic element information.

In an example, when there is no conflict among the second trajectories corresponding to the plurality of obstacle vehicles, the simulation scene is generated based on the first trajectory corresponding to the target vehicle, the second trajectories corresponding to the plurality of obstacle vehicles, and the first driving parameter information of the target vehicle, the second driving parameter information of the obstacle vehicles, and the traffic element information.

In an example, in order to simplify the generated simulation scene of intersections and improve the generation efficiency of the simulation scene of intersections, one or more third trajectories intersected with the first trajectory can be obtained from the second trajectories corresponding to the plurality of obstacle vehicles. Therefore, the one or more simulation scenes are generated according to the first trajectory corresponding to the target vehicle, the one or more third trajectories intersected with the first trajectory and corresponding to the plurality of obstacle vehicles, the first driving parameter, the second driving parameter information of the plurality of obstacle vehicles and the traffic element information.

In block 606, a first simulation scene is generated based on the first trajectory, the second trajectory corresponding to a first obstacle vehicle, the first driving parameter information, the second driving parameter information, and the traffic element information.

In block 607, a second simulation scene is generated based on the first trajectory, the second trajectory corresponding to a second obstacle vehicle, the first driving parameter information, the second driving parameter information, and the traffic element information.

In an example, if there is a conflict between the second trajectory corresponding to the first obstacle vehicle and the second trajectory corresponding to the second obstacle vehicle, a first simulation scene and a second simulation scene are generated respectively based on the second trajectory corresponding to the first obstacle vehicle and the second trajectory corresponding to the second obstacle vehicle.

In an example, in order to simplify the generated simulation scene of intersections and improve the generation efficiency of the simulation scene of intersections, a third trajectory intersected with the first trajectory are obtained from at least one second trajectory corresponding to the first obstacle vehicle. The first simulation scene is generated based on the first trajectory corresponding to the target vehicle, the third trajectory intersected with the first trajectory corresponding to the first obstacle vehicle, the first driving parameter, the second driving parameter information of the first obstacle vehicle and the traffic element information. In addition, a third trajectory intersected with the first trajectory is obtained from the at least one second trajectory corresponding to the second obstacle vehicle. The second simulation scene is generated according to the first trajectory corresponding to the target vehicle, the third trajectory intersected with the first trajectory corresponding to the second obstacle vehicle, the first driving parameter, the second driving parameter information of the second obstacle vehicle, and the traffic element information.

For example, it is assumed that the target vehicle m corresponds to the trajectory D, the obstacle vehicle n1 corresponds to the trajectories E and F, the obstacle vehicle n2 corresponds to the trajectory G, and the obstacle vehicle n3 corresponds to the trajectory H. The trajectory D is intersected with the trajectory E corresponding to the obstacle vehicle n1, the trajectory G corresponding to the obstacle vehicle n2 and the trajectory H corresponding to the obstacle vehicle n3. There is a conflict between the trajectory E corresponding to the obstacle vehicle n1 and the trajectory G corresponding to the obstacle vehicle n2, and there is a conflict between the trajectory F corresponding to the obstacle vehicle n1 and the trajectory G corresponding to the obstacle vehicle n2. A simulation scene 4 is generated according to the trajectory D corresponding to the target vehicle m and the corresponding first driving parameter information, the trajectory E corresponding to the obstacle vehicle n1 and the corresponding second driving parameter information, the trajectory H corresponding to the obstacle vehicle n3 and the corresponding second driving parameter information, and the traffic element information. A simulation scene 5 is generated according to the trajectory D corresponding to the target vehicle m and the corresponding first driving parameter information, the corresponding trajectory G of the obstacle vehicle n2 and the corresponding second driving parameter information, the corresponding trajectory H of the obstacle vehicle n3 and the corresponding second driving parameter information, and the traffic element information.

When there are multiple obstacle vehicles, it is determined whether there is a conflict between the second trajectories corresponding to the plurality of obstacle vehicles. When there is a conflict between the second trajectory corresponding to the first obstacle vehicle and the second obstacle corresponding to the second obstacle vehicle, the first simulation scene and the second simulation scene are generated respectively based on the second trajectory corresponding to the first obstacle vehicle and the second trajectory corresponding to the second obstacle vehicle, such that the situation where multiple obstacles collide in the generated simulation scene is avoided.

With the method for generating a simulation scene according to embodiments of the disclosure, the traffic element information related to the intersections contained in the map to be processed, the first driving parameter information of the target vehicle, and the second driving parameter information of the obstacle vehicle are obtained. There are a plurality of obstacle vehicles. The first trajectory corresponding to the target vehicle is generated based on the first driving parameter information and the traffic element information. The second trajectory corresponding to the obstacle vehicle is generated based on the second driving parameter information and the traffic element information. It is determined whether there is a conflict between the second trajectories corresponding to the plurality of obstacle vehicles. If there is no conflict between each two second trajectories corresponding to the plurality of obstacle vehicles, the simulation scene is generated based on the first trajectory corresponding to the target vehicle, the second trajectories corresponding to the plurality of obstacle vehicles, the first driving parameter information corresponding to the target vehicle, the second driving parameter information corresponding to the plurality of obstacle vehicles, and the traffic element information. If there is a conflict between the second trajectory corresponding to the first obstacle vehicle and the second trajectory corresponding to the second obstacle vehicle, the first simulation scene is generated based on the first trajectory, the second trajectory corresponding to the first obstacle vehicle, the first driving parameter information, the second driving parameter information, and the traffic element information, and a second simulation scene is generated based on the first trajectory, the second trajectory corresponding to the second obstacle vehicle, the first driving parameter information, the second driving parameter information, and the traffic element information. Therefore, when there are a plurality of obstacle vehicles, the simulation scene of the intersections can be generated automatically, conveniently and efficiently according to the traffic element information related to the intersections contained in the map to be processed, the first driving parameter information of the target vehicle and the second driving parameter information of the obstacle vehicle, which saves a lot of labor and saves time cost, and improves the coverage of the scene.

An apparatus for generating a simulation scene according to the disclosure will be described below with reference to FIG. 7.

Figure 7:
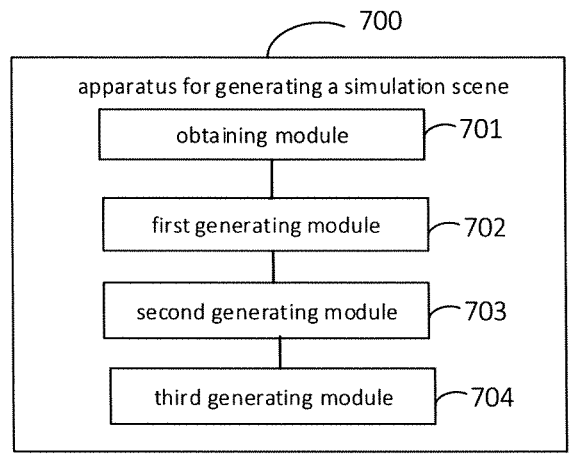
FIG. 7 is a schematic diagram illustrating an apparatus for generating a simulation scene according to a fifth embodiment of the disclosure.

FIG. 7 is a schematic diagram illustrating an apparatus for generating a simulation scene according to a fifth embodiment of the disclosure.

As illustrated in FIG. 7, the apparatus 700 for generating a simulation scene of the disclosure includes: an obtaining module 701, a first generating module 702, a second generating module 703, and a third generating module 704.

The obtaining module 701 is configured to obtain traffic element information related to intersections contained in a map to be processed, first driving parameter information of a target vehicle, and second driving parameter information of an obstacle vehicle.

The first generating module 702 is configured to generate a first trajectory corresponding to the target vehicle based on the first driving parameter information and the traffic element information.

The second generating module 703 is configured to generate a second trajectory corresponding to the obstacle vehicle based on the second driving parameter information and the traffic element information.

The third generating module 704 is configured to generate a simulation scene based on the first trajectory, the second trajectory, the first driving parameter information, the second driving parameter information, and the traffic element information.

It should be noted that, the apparatus for generating a simulation scene provided in the embodiment can execute the method for generating a simulation scene in the foregoing embodiments. The apparatus for generating the simulation scene can be an electronic device, or can be integrated in the electronic device, so as to realize the automatic and efficient generation of the simulation scene of the intersections, which saves a lot of labor and saves time cost, and improves the coverage of the scene.

The electronic device can be any stationary or mobile computing device capable of data processing, such as mobile computing devices such as notebook computers, smart phones, and wearable devices, or stationary computing devices such as desktop computers, or servers, or other types of computing devices, which are not limited in the disclosure.

It is to be noted that the foregoing description of the embodiments of the method for generating a simulation scene is also applicable to the apparatus for generating a simulation scene of the disclosure, and details are not repeated here.

With the apparatus for generating a simulation scene of the disclosure, the traffic element information related to the intersections contained in the map to be processed, the first driving parameter information of the target vehicle, and the second driving parameter information of the obstacle vehicle are obtained. The first trajectory corresponding to the target vehicle is generated based on the first driving parameter information and the traffic element information. The second trajectory corresponding to the obstacle vehicle is generated based on the second driving parameter information and the traffic element information. The simulation scene is generated based on the first trajectory, the second trajectory, the first driving parameter information, the second driving parameter information, and the traffic element information. In this way, the simulation scene of the intersections can be generated automatically and efficiently according to the traffic element information related to the intersections contained in the map to be processed, the first driving parameter information of the target vehicle and the second driving parameter information of the obstacle vehicle, which saves a lot of labor and saves time cost, and improves the coverage of the scene.

The apparatus for generating a simulation scene of the disclosure will be described below with reference to FIG. 8.

Figure 8:
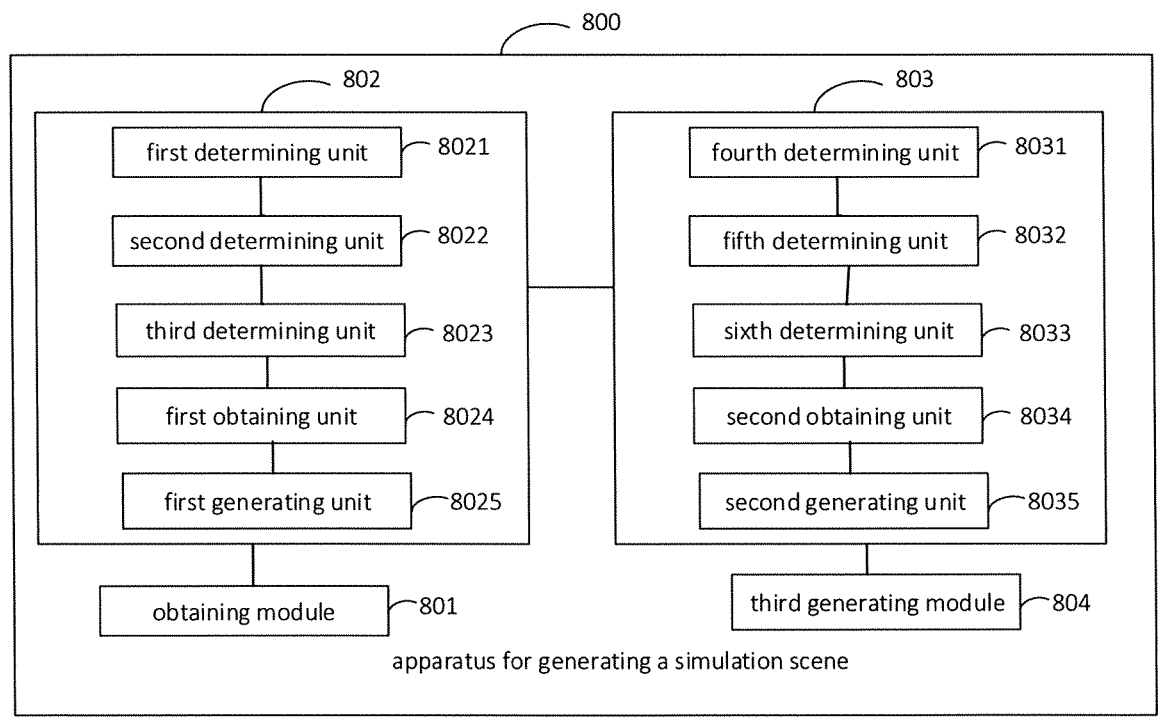
FIG. 8 is a schematic diagram illustrating an apparatus for generating a simulation scene according to a sixth embodiment of the disclosure.

FIG. 8 is a schematic diagram of an apparatus for generating a simulation scene according to a sixth embodiment of the disclosure.

As shown in FIG. 8, an apparatus 800 for generating a simulation scene may include: an obtaining module 801, a first generating module 802, a second generating module 803, and a third generating module 804. The obtaining module 801, the first generating module 802, the second generating module 803 and the third generating module 804 in FIG. 8 have the same function and structure as the obtaining module 701, the first generating module 702, the second generating module 703 and the third generating module in FIG. 7 respectively.

In an example, the first driving parameter information includes the first driving behavior information of the target vehicle, start point position information and end point position information of the first trajectory, and the traffic element information includes lane information of lanes around the intersections. The first generating module 802 includes: a first determining unit 8021, a second determining unit 8022, a third determining unit 8023, a first obtaining unit 8024 and a first generating unit 8025.

The first determining unit 8021 is configured to determine a first lane where the target vehicle is located based on the first driving behavior information and the lane information.

The second determining unit 8022 is configured to determine a start point position of the first trajectory based on the start point position information of the first trajectory and the lane information of the first lane.

The third determining unit 8023 is configured to determine an end point position of the first trajectory based on the end point position information of the first trajectory and the lane information of the first lane.

The first obtaining unit 8024 is configured to obtain a set of first target points between the start point position and the end point position of the first trajectory, where each first target point is a point on a central line of the first lane.

The first generating unit 8025 is configured to generate the first trajectory based on the set of first target points.

In an example embodiment, the second driving parameter information includes second driving behavior information of the obstacle vehicle, start point position information and end point position information of the second trajectory, and the traffic element information includes lane information of lanes around the intersection. The second generating module 803 includes: a fourth determining unit 8031, a fifth determining unit 8032, a sixth determining unit 8033, a second obtaining unit 8034 and a second generating unit 8035.

The fourth determining unit 8031 is configured to determine a second lane where the obstacle vehicle is located based on the second driving behavior information and the lane information.

The fifth determining unit 8032 is configured to determine a start point position of the second trajectory based on the start point position information of the second trajectory and the lane information of the second lane.

The sixth determining unit 8033 is configured to determine an end point position of the second trajectory based on the end point position information of the second trajectory and the lane information of the second lane.

The second obtaining unit 8034 is configured to obtain a set of second target points between the start point position and the end point position of the second trajectory, where each second target point is a point on a central line of the second lane.

The second generating unit 8035 is configured to generate the second trajectory based on the set of second target points.

In an example embodiment, the second driving parameter information includes second driving behavior information of the obstacle vehicle, a start point position and end point position information of the second trajectory, and the traffic element information includes lane information of lanes around the intersections. The second generating module 803 includes: a seventh determining unit, an eighth determining unit, a third obtaining unit and a third generating unit.

The seventh determining unit is configured to determine a second lane where the obstacle vehicle is located based on the second driving behavior information and the lane information.

The eighth determining unit is configured to determine an end point position of the second trajectory based on the end point position information of the second trajectory and the lane information of the second lane.

The third obtaining unit is configured to obtain a set of second target points between the start point position and the end point position of the second trajectory, where each second target point is a point on a central line of the second lane.

The third generating unit is configured to generate the second trajectory based on the set of second target points.

In an example embodiment, the obtaining module 801 includes: a ninth determining unit, a tenth determining unit, a fourth obtaining unit, an eleventh determining module and a twelfth determining module.

The ninth determining unit is configured to determine a target scene complexity degree and the end point position information of the second trajectory based on third configuration information from a user.

The tenth determining unit is configured to determine target scene state information corresponding to the target scene complexity degree based on a correspondence between scene complexity degrees and scene state information.

The fourth obtaining unit is configured to obtain, from the target scene state information, an initial position and a speed of the obstacle vehicle.

The eleventh determining module is configured to determine the second driving behavior information of the obstacle vehicle based on the initial position of the obstacle vehicle, the speed of the obstacle vehicle, and the lane information.

The twelfth determining module is configured to determine the initial position of the obstacle vehicle as the start point position of the second trajectory.

In an example embodiment, the second lane allows multiple travelling directions, and the sixth determining unit or the eighth determining unit includes: a determining sub-unit, configured to determine the end point position of the second trajectory corresponding to each travelling direction based on the end position information of the second trajectory and the lane information of the second lane.

The second obtaining unit or the third obtaining unit includes: an obtaining sub-unit, configured to obtain the set of second target points between the start point position of the second trajectory and the end point position of the second trajectory in each travelling direction, where each second target point is a point on the central line of the second lane in a corresponding travelling direction.

In an example embodiment, the third generating module 804 includes: a fifth obtaining unit and a fourth generating unit.

The fifth obtaining unit is configured to obtain, from at least one second trajectory, a third trajectory intersected with the first trajectory.

The fourth generating unit is configured to generate the simulation scene corresponding to the first trajectory based on the first trajectory, the third trajectory intersected with the first trajectory, the first driving parameter information, the second driving parameter information, and the traffic element information.

In an example embodiment, there are a plurality of obstacle vehicles, and the apparatus 800 includes: a judging module, configured to determine whether there is a conflict between the second trajectories corresponding to the plurality of obstacle vehicles.

The third generating module 804 includes: a fifth generating unit, configured to generate a first simulation scene based on the first trajectory, the second trajectory corresponding to a first obstacle vehicle, the first driving parameter information, the second driving parameter information, and the traffic element information, and generate a second simulation scene based on the first trajectory, the second trajectory corresponding to a second obstacle vehicle, the first driving parameter information, the second driving parameter information, and the traffic element information, in response to a conflict existing between the second trajectory corresponding to the first obstacle vehicle and the second trajectory corresponding to the second obstacle vehicle.

In an example embodiment, the traffic element information includes initial state information of traffic lights.

The third generating module 804 includes: a sixth obtaining unit, an adjusting unit and a sixth generating unit.

The sixth obtaining unit is configured to obtain pedestrian traveling parameter information and control information of the traffic light based on fourth configuration information from the user.

The adjusting unit is configured to obtain simulation state information of the traffic light by adjusting the initial state information based on the control information.

The sixth generating unit is configured to generate the simulation scene based on the first trajectory, the second trajectory, the first driving parameter information, the second driving parameter information, the pedestrian traveling parameter information, and the simulation state information.

It should be noted that the foregoing description of the embodiments of the method for generating a simulation scene is also applicable to the apparatus for generating a simulation scene of the disclosure, and details are not repeated here.

With the apparatus for generating a simulation scene of the disclosure, the traffic element information related to the intersections contained in the map to be processed, the first driving parameter information of the target vehicle, and the second driving parameter information of the obstacle vehicle are obtained. The first trajectory corresponding to the target vehicle is generated based on the first driving parameter information and the traffic element information. The second trajectory corresponding to the obstacle vehicle is generated based on the second driving parameter information and the traffic element information. The simulation scene is generated based on the first trajectory, the second trajectory, the first driving parameter information, the second driving parameter information, and the traffic element information. In this way, the simulation scene of the intersection can be generated automatically and efficiently according to the traffic element information related to the intersections contained in the map to be processed, the first driving parameter information of the target vehicle and the second driving parameter information of the obstacle vehicle, which saves a lot of labor and saves time cost, and improves the coverage of the scene.

According to the embodiments of the disclosure, the disclosure also provides an electronic device, a readable storage medium and a computer program product.

Figure 9:
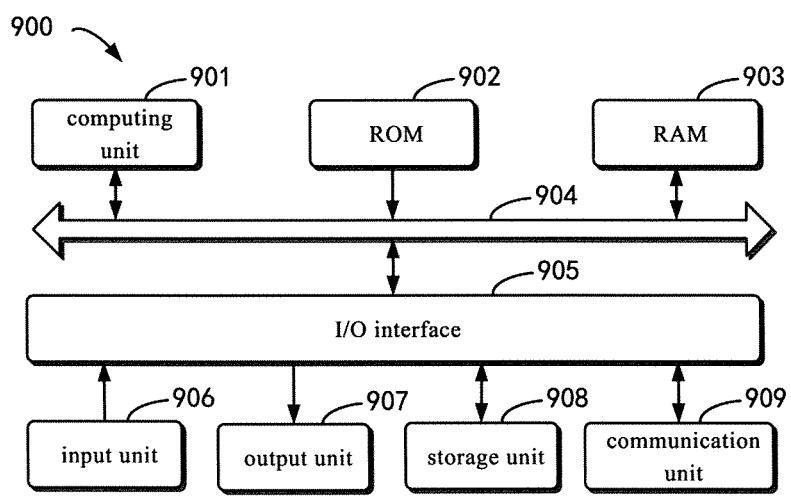
FIG. 9 is a block diagram illustrating an electronic device used to implement the method for generating a simulation scene according to an embodiment of the disclosure.

FIG. 9 is a block diagram of an electronic device 900 according to embodiments of the disclosure. Electronic devices are intended to represent various forms of digital computers, such as laptop computers, desktop computers, workbenches, personal digital assistants, servers, blade servers, mainframe computers, and other suitable computers. Electronic devices may also represent various forms of mobile devices, such as personal digital processing, cellular phones, smart phones, wearable devices, and other similar computing devices. The components shown here, their connections and relations, and their functions are merely examples, and are not intended to limit the implementation of the disclosure described and/or required herein.

As illustrated in FIG. 9, the device 900 includes a computing unit 901 performing various appropriate actions and processes based on computer programs stored in a read-only memory (ROM) 902 or computer programs loaded from the storage unit 908 to a random access memory (RAM) 903. In the RAM 903, various programs and data required for the operation of the device 900 are stored. The computing unit 901, the ROM 902, and the RAM 903 are connected to each other through a bus 904. An input/output (I/O) interface 905 is also connected to the bus 904.

Components in the device 900 are connected to the I/O interface 905, including: an inputting unit 906, such as a keyboard, a mouse; an outputting unit 907, such as various types of displays, speakers; a storage unit 908, such as a disk, an optical disk; and a communication unit 909, such as network cards, modems, and wireless communication transceivers. The communication unit 909 allows the device 900 to exchange information/data with other devices through a computer network such as the Internet and/or various telecommunication networks.

The computing unit 901 may be various general-purpose and/or dedicated processing components with processing and computing capabilities. Some examples of computing unit 901 include, but are not limited to, a central processing unit (CPU), a graphics processing unit (GPU), various dedicated AI computing chips, various computing units that run machine learning model algorithms, and a digital signal processor (DSP), and any appropriate processor, controller and microcontroller. The computing unit 901 executes the various methods and processes described above, such as the method for reporting asynchronous data. For example, in some embodiments, the method may be implemented as a computer software program, which is tangibly contained in a machine-readable medium, such as the storage unit 908. In some embodiments, part or all of the computer program may be loaded and/or installed on the device 900 via the ROM 902 and/or the communication unit 909. When the computer program is loaded on the RAM 903 and executed by the computing unit 901, one or more steps of the method described above may be executed. Alternatively, in other embodiments, the computing unit 901 may be configured to perform the method in any other suitable manner (for example, by means of firmware).

Various implementations of the systems and techniques described above may be implemented by a digital electronic circuit system, an integrated circuit system, Field Programmable Gate Arrays (FPGAs), Application Specific Integrated Circuits (ASICs), Application Specific Standard Products (ASSPs), System on Chip (SOCs), Load programmable logic devices (CPLDs), computer hardware, firmware, software, and/or a combination thereof. These various embodiments may be implemented in one or more computer programs, the one or more computer programs may be executed and/or interpreted on a programmable system including at least one programmable processor, which may be a dedicated or general programmable processor for receiving data and instructions from the storage system, at least one input device and at least one output device, and transmitting the data and instructions to the storage system, the at least one input device and the at least one output device.

The program code configured to implement the method of the disclosure may be written in any combination of one or more programming languages. These program codes may be provided to the processors or controllers of general-purpose computers, dedicated computers, or other programmable data processing devices, so that the program codes, when executed by the processors or controllers, enable the functions/operations specified in the flowchart and/or block diagram to be implemented. The program code may be executed entirely on the machine, partly executed on the machine, partly executed on the machine and partly executed on the remote machine as an independent software package, or entirely executed on the remote machine or server.

In the context of the disclosure, a machine-readable medium may be a tangible medium that may contain or store a program for use by or in connection with an instruction execution system, apparatus, or device. The machine-readable medium may be a machine-readable signal medium or a machine-readable storage medium. A machine-readable medium may include, but is not limited to, an electronic, magnetic, optical, electromagnetic, infrared, or semiconductor system, apparatus, or device, or any suitable combination of the foregoing. More specific examples of machine-readable storage media include electrical connections based on one or more wires, portable computer disks, hard disks, random access memories (RAM), read-only memories (ROM), electrically programmable read-only-memory (EPROM), flash memory, fiber optics, compact disc read-only memories (CD-ROM), optical storage devices, magnetic storage devices, or any suitable combination of the foregoing.

In order to provide interaction with a user, the systems and techniques described herein may be implemented on a computer having a display device (e.g., a Cathode Ray Tube (CRT) or a Liquid Crystal Display (LCD) monitor for displaying information to a user); and a keyboard and pointing device (such as a mouse or trackball) through which the user can provide input to the computer. Other kinds of devices may also be used to provide interaction with the user. For example, the feedback provided to the user may be any form of sensory feedback (e.g., visual feedback, auditory feedback, or haptic feedback), and the input from the user may be received in any form (including acoustic input, voice input, or tactile input).

The systems and technologies described herein can be implemented in a computing system that includes background components (for example, a data server), or a computing system that includes middleware components (for example, an application server), or a computing system that includes front-end components (for example, a user computer with a graphical user interface or a web browser, through which the user can interact with the implementation of the systems and technologies described herein), or include such background components, intermediate computing components, or any combination of front-end components. The components of the system may be interconnected by any form or medium of digital data communication (e.g., a communication network). Examples of communication networks include: local area network (LAN), wide area network (WAN), the Internet and Block-chain network.

The computer system may include a client and a server. The client and server are generally remote from each other and interacting through a communication network. The client-server relation is generated by computer programs running on the respective computers and having a client-server relation with each other. The server may be a cloud server, also known as a cloud computing server or a cloud host, which is a host product in the cloud computing service system to solve the problem that there are the defects of difficult management and weak business expansion in the traditional physical hosts and (Virtual Private Server) VPS services. The server may be a server of a distributed system, or a server combined with a block-chain.

The disclosure relates to the technical field of artificial intelligence, in particular to the technical fields of intelligent transportation and autonomous driving.

It is noted that artificial intelligence is a discipline that studies certain thinking processes and intelligent behaviors (such as learning, reasoning, thinking and planning) that allow computers to simulate life, which has both hardware-level technologies and software-level technologies. Artificial intelligence hardware technology generally includes technologies such as sensors, dedicated artificial intelligence chips, cloud computing, distributed storage, and big data processing. Artificial intelligence software technology generally includes computer vision technology, speech recognition technology, natural language processing technology, and its learning/deep learning, big data processing technology, knowledge map technology and other aspects.

According to the technical solution of the embodiments of the disclosure, according to the traffic element information related to the intersection contained in the map to be processed, the first driving parameter information of the target vehicle and the second driving parameter information of the obstacle vehicle, the simulation scene is generated in an automatic, convenient and efficient manner, which saves a lot of labor and saves time cost, and improves the coverage of the scene.

It should be understood that the various forms of processes shown above can be used to reorder, add or delete steps. For example, the steps described in the disclosure could be performed in parallel, sequentially, or in a different order, as long as the desired result of the technical solution disclosed in the disclosure is achieved, which is not limited herein.

The above specific embodiments do not constitute a limitation on the protection scope of the disclosure. Those skilled in the art should understand that various modifications, combinations, sub-combinations and substitutions can be made according to design requirements and other factors. Any modification, equivalent replacement and improvement made within the spirit and principle of the disclosure shall be included in the protection scope of the disclosure.

What is claimed is:

1. A method for generating a simulation scene, comprising:
    obtaining traffic element information related to intersections contained in a map to be processed, first driving parameter information of a target vehicle, and second driving parameter information of an obstacle vehicle;
    generating a first trajectory corresponding to the target vehicle based on the first driving parameter information and the traffic element information;
    generating a second trajectory corresponding to the obstacle vehicle based on the second driving parameter information and the traffic element information;
    generating a simulation scene based on the first trajectory, the second trajectory, the first driving parameter information, the second driving parameter information, and the traffic element information; and
    simulating an automatic driving process through an automatic driving system based on the simulation scene;
    wherein obtaining the second driving parameter information of the obstacle vehicle comprises:
        determining a target scene complexity degree and an end point position information of the second trajectory based on third configuration information from a user;
        determining target scene state information corresponding to the target scene complexity degree based on a correspondence between scene complexity degrees and scene state information;
        obtaining, from the target scene state information, an initial position and a speed of the obstacle vehicle;
        determining second driving behavior information of the obstacle vehicle based on the initial position of the obstacle vehicle, the speed of the obstacle vehicle, and the lane information; and
        determining the initial position of the obstacle vehicle as a start point position of the second trajectory.

2. The method according to claim 1, wherein the first driving parameter information comprises first driving behavior information of the target vehicle, start point position information and end point position information of the first trajectory, and the traffic element information comprises lane information of lanes around the intersections; and
    wherein generating the first trajectory corresponding to the target vehicle based on the first driving parameter information and the traffic element information comprises:
        determining a first lane where the target vehicle is located based on the first driving behavior information and the lane information;
        determining a start point position of the first trajectory based on the start point position information of the first trajectory and the lane information of the first lane;
        determining an end point position of the first trajectory based on the end point position information of the first trajectory and the lane information of the first lane;
        obtaining a set of first target points between the start point position and the end point position of the first trajectory, wherein each first target point is a point on a central line of the first lane; and
        generating the first trajectory based on the set of first target points.

3. The method according to claim 1, wherein the second driving parameter information comprises second driving behavior information of the obstacle vehicle, start point position information and end point position information of the second trajectory, and the traffic element information comprises lane information of lanes around the intersection;
    wherein generating the second trajectory corresponding to the obstacle vehicle based on the second driving parameter information and the traffic element information comprises:
        determining a second lane where the obstacle vehicle is located based on the second driving behavior information and the lane information;
        determining a start point position of the second trajectory based on the start point position information of the second trajectory and the lane information of the second lane;
        determining an end point position of the second trajectory based on the end point position information of the second trajectory and the lane information of the second lane;
        obtaining a set of second target points between the start point position and the end point position of the second trajectory, where each second target point is a point on a central line of the second lane; and
        generating the second trajectory based on the set of second target points.

4. The method according to claim 1, wherein the second driving parameter information comprises the second driving behavior information of the obstacle vehicle, the start point position and the end point position information of the second trajectory, and the traffic element information comprises lane information of lanes around the intersection; and wherein generating the second trajectory of the obstacle vehicle based on the second driving parameter information and the traffic element information comprises:

determining a second lane where the obstacle vehicle is located based on the second driving behavior information and the lane information;

determining an end point position of the second trajectory based on the end position information of the second trajectory and the lane information of the second lane;

obtaining a set of second target points between the start point position and the end point position of the second trajectory, where each second target point is a point on a central line of the second lane; and generating the second trajectory based on the set of second target points.

5. The method according to claim 3, wherein the second lane allows multiple travelling directions; and wherein determining the end point position of the second trajectory based on the end point position information of the second trajectory and the lane information of the second lane comprises:

determining the end point position of the second trajectory corresponding to each travelling direction based on the end position information of the second trajectory and the lane information of the second lane; and wherein obtaining the set of second target points between the start point position and the end point position of the second trajectory comprises:

obtaining the set of second target points between the start point position of the second trajectory and the end point position of the second trajectory in each travelling direction, wherein each second target point is a point on the central line of the second lane in a corresponding travelling direction.

6. The method according to claim 1, wherein generating the simulation scene based on the first trajectory, the second trajectory, the first driving parameter information, the second driving parameter information, and the traffic element information comprises:

obtaining, from at least one second trajectory, a third trajectory intersected with the first trajectory; and generating the simulation scene corresponding to the first trajectory based on the first trajectory, the third trajectory intersected with the first trajectory, the first driving parameter information, the second driving parameter information, and the traffic element information.

7. The method according to claim 1, wherein there are a plurality of obstacle vehicles, and wherein generating the simulation scene based on the first trajectory, the second trajectory, the first driving parameter information, the second driving parameter information, and the traffic element information, comprises:

determining whether there is a conflict between the second trajectories corresponding to the plurality of obstacle vehicles;

generating a first simulation scene based on the first trajectory, the second trajectory corresponding to a first obstacle vehicle, the first driving parameter information, the second driving parameter information, and the traffic element information, and generating a second simulation scene based on the first trajectory, the second trajectory corresponding to a second obstacle vehicle, the first driving parameter information, the second driving parameter information, and the traffic element information, in response to determining that there is a conflict between the second trajectory corresponding to the first obstacle vehicle and the second trajectory corresponding to the second obstacle vehicle.

8. The method according to claim 1, wherein the traffic element information comprises initial state information of traffic light;

wherein generating the simulation scene based on the first trajectory, the second trajectory, the first driving parameter information, the second driving parameter information, and the traffic element information comprises:

obtaining pedestrian driving parameter information and control information of the traffic light based on fourth configuration information from the user;

obtaining simulation state information of the traffic light by adjusting the initial state information based on the control information; and generating the simulation scene based on the first trajectory, the second trajectory, the first driving parameter information, the second driving parameter information, the pedestrian traveling parameter information, and the simulation state information.

9. An electronic device, comprising:

at least one processor; and a memory communicatively coupled to the at least one processor; wherein, the memory stores instructions executable by the at least one processor, and when the instructions are executed by the at least one processor, the at least one processor is caused to:

obtain traffic element information related to intersections contained in a map to be processed, first driving parameter information of a target vehicle, and second driving parameter information of an obstacle vehicle;

generate a first trajectory corresponding to the target vehicle based on the first driving parameter information and the traffic element information;

generate a second trajectory corresponding to the obstacle vehicle based on the second driving parameter information and the traffic element information;

generate a simulation scene based on the first trajectory, the second trajectory, the first driving parameter information, the second driving parameter information, and the traffic element information; and simulate an automatic driving process through an automatic driving system based on the simulation scene;

wherein the at least one processor obtains the second driving parameter information of the obstacle vehicle by:

determining a target scene complexity degree and an end point position information of the second trajectory based on third configuration information from a user;

determining target scene state information corresponding to the target scene complexity degree based on a correspondence between scene complexity degrees and scene state information;

obtaining, from the target scene state information, an initial position and a speed of the obstacle vehicle;

determining second driving behavior information of the obstacle vehicle based on the initial position of the obstacle vehicle, the speed of the obstacle vehicle, and the lane information; and determining the initial position of the obstacle vehicle as a start point position of the second trajectory.

10. The electronic device of claim 9, wherein the first driving parameter information comprises first driving behavior information of the target vehicle, start point position information and end point position information of the first trajectory, and the traffic element information comprises lane information of lanes around the intersections; and the at least one processor is caused to:
  determine a first lane where the target vehicle is located based on the first driving behavior information and the lane information;
  determine a start point position of the first trajectory based on the start point position information of the first trajectory and the lane information of the first lane;
  determine an end point position of the first trajectory based on the end point position information of the first trajectory and the lane information of the first lane;
  obtain a set of first target points between the start point position and the end point position of the first trajectory, wherein each first target point is a point on a central line of the first lane; and
  generate the first trajectory based on the set of first target points.

11. The electronic device of claim 9, wherein the second driving parameter information comprises second driving behavior information of the obstacle vehicle, start point position information and end point position information of the second trajectory, and the traffic element information comprises lane information of lanes around the intersection; and the at least one processor is configured to:
  determine a second lane where the obstacle vehicle is located based on the second driving behavior information and the lane information;
  determine a start point position of the second trajectory based on the start point position information of the second trajectory and the lane information of the second lane;
  determine an end point position of the second trajectory based on the end point position information of the second trajectory and the lane information of the second lane;
  obtain a set of second target points between the start point position and the end point position of the second trajectory, where each second target point is a point on a central line of the second lane; and
  generate the second trajectory based on the set of second target points.

12. The electronic device of claim 9, wherein the second driving parameter information comprises thr second driving behavior information of the obstacle vehicle, the start point position and the end point position information of the second trajectory, and the traffic element information comprises lane information of lanes around the intersection; and the at least one processor is configured to:
  determine a second lane where the obstacle vehicle is located based on the second driving behavior information and the lane information;
  determine an end point position of the second trajectory based on the end position information of the second trajectory and the lane information of the second lane;
  obtain a set of second target points between the start point position and the end point position of the second trajectory, where each second target point is a point on a central line of the second lane; and
  generate the second trajectory based on the set of second target points.

13. The electronic device of claim 9, wherein the second lane allows multiple travelling directions; and the at least one processor is configured to:
  determine the end point position of the second trajectory corresponding to each travelling direction based on the end position information of the second trajectory and the lane information of the second lane; and
  obtain the set of second target points between the start point position of the second trajectory and the end point position of the second trajectory in each travelling direction, wherein each second target point is a point on the central line of the second lane in a corresponding travelling direction.

14. The electronic device of claim 9, wherein the at least one processor is configured to:
  obtain, from at least one second trajectory, a third trajectory intersected with the first trajectory; and
  generate the simulation scene corresponding to the first trajectory based on the first trajectory, the third trajectory intersected with the first trajectory, the first driving parameter information, the second driving parameter information, and the traffic element information.

15. The electronic device of claim 9, wherein there are a plurality of obstacle vehicles, and the at least one processor is configured to:
  determine whether there is a conflict between the second trajectories corresponding to the plurality of obstacle vehicles;
  generate a first simulation scene based on the first trajectory, the second trajectory corresponding to a first obstacle vehicle, the first driving parameter information, the second driving parameter information, and the traffic element information, and generate a second simulation scene based on the first trajectory, the second trajectory corresponding to a second obstacle vehicle, the first driving parameter information, the second driving parameter information, and the traffic element information, in response to determining that there is a conflict between the second trajectory corresponding to the first obstacle vehicle and the second trajectory corresponding to the second obstacle vehicle.

16. The electronic device of claim 9, wherein the traffic element information comprises initial state information of traffic light; and the at least one processor is configured to:
  obtain pedestrian driving parameter information and control information of the traffic light based on fourth configuration information from the user;
  obtain simulation state information of the traffic light by adjusting the initial state information based on the control information; and
  generate the simulation scene based on the first trajectory, the second trajectory, the first driving parameter information, the second driving parameter information, the pedestrian traveling parameter information, and the simulation state information.

17. A non-transitory computer-readable storage medium storing computer instructions, wherein the computer instructions are configured to cause a computer to execute the method for generating a simulation scene, the method comprising:
  obtaining traffic element information related to intersections contained in a map to be processed, first driving parameter information of a target vehicle, and second driving parameter information of an obstacle vehicle;
  generating a first trajectory corresponding to the target vehicle based on the first driving parameter information and the traffic element information;
  generating a second trajectory corresponding to the obstacle vehicle based on the second driving parameter information and the traffic element information; and
  generating a simulation scene based on the first trajectory, the second trajectory, the first driving parameter information, the second driving parameter information, and the traffic element information;

simulating an automatic driving process through an automatic driving system based on the simulation scene;

wherein obtaining the second driving parameter information of the obstacle vehicle comprises:

determining a target scene complexity degree and an end point position information of the second trajectory based on third configuration information from a user;

determining target scene state information corresponding to the target scene complexity degree based on a correspondence between scene complexity degrees and scene state information;

obtaining, from the target scene state information, an initial position and a speed of the obstacle vehicle;

determining second driving behavior information of the obstacle vehicle based on the initial position of the obstacle vehicle, the speed of the obstacle vehicle, and the lane information; and determining the initial position of the obstacle vehicle as a start point position of the second trajectory.

18. The non-transitory computer-readable storage medium of claim 17, wherein the first driving parameter information comprises first driving behavior information of the target vehicle, start point position information and end point position information of the first trajectory, and the traffic element information comprises lane information of lanes around the intersections; and wherein generating the first trajectory corresponding to the target vehicle based on the first driving parameter information and the traffic element information comprises:

determining a first lane where the target vehicle is located based on the first driving behavior information and the lane information;

determining a start point position of the first trajectory based on the start point position information of the first trajectory and the lane information of the first lane;

determining an end point position of the first trajectory based on the end point position information of the first trajectory and the lane information of the first lane;

obtaining a set of first target points between the start point position and the end point position of the first trajectory, wherein each first target point is a point on a central line of the first lane; and generating the first trajectory based on the set of first target points.

* * * * *